(12) United States Patent
Snyder et al.

(10) Patent No.: US 12,022,647 B2
(45) Date of Patent: Jun. 25, 2024

(54) MICROELECTRONIC DEVICES INCLUDING MEMORY CELL STRUCTURES, AND RELATED METHODS AND ELECTRONIC SYSTEMS

(71) Applicant: Micron Technology, Inc., Boise, ID (US)

(72) Inventors: Stephen D. Snyder, Boise, ID (US); Thomas A. Figura, Boise, ID (US); Siva Naga Sandeep Chalamalasetty, Meridian, ID (US); Ping Chieh Chiang, Boise, ID (US); Scott L. Light, Boise, ID (US); Yashvi Singh, Boise, ID (US); Yan Li, Boise, ID (US); Song Guo, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/323,516

(22) Filed: May 18, 2021

(65) Prior Publication Data
US 2022/0375942 A1   Nov. 24, 2022

(51) Int. Cl.
*H10B 12/00* (2023.01)
*G11C 5/06* (2006.01)
*H01L 27/06* (2006.01)

(52) U.S. Cl.
CPC .............. *H10B 12/482* (2023.02); *G11C 5/06* (2013.01); *H01L 27/0688* (2013.01); *H10B 12/30* (2023.02); *H10B 12/488* (2023.02)

(58) Field of Classification Search
CPC ........... H01L 27/10885; H01L 27/0688; H01L 27/10805; H01L 27/10891; G11C 5/06; H10B 12/482; H10B 12/30; H10B 12/488; H10B 12/02

USPC ......................................................... 257/296
See application file for complete search history.

(56) References Cited

U.S. PATENT DOCUMENTS

| | | | | |
|---|---|---|---|---|
| 5,378,906 | A | * | 1/1995 | Lee .................. H10B 12/31 257/305 |
| 6,137,713 | A | * | 10/2000 | Kuroda .............. G11C 11/24 257/E27.084 |
| 9,618,846 | B2 | | 4/2017 | Shamma et al. |
| 9,881,924 | B2 | * | 1/2018 | Wang .............. H10B 12/312 |

(Continued)

OTHER PUBLICATIONS

Decoster et al., Exploration of EUV-Based Self-Aligned Multipatterning Options Targeting Pitches Below 20nm,https://www.spiedigitallibrary.org/conference-proceedings-or-spie/10960/109600L/Exploration-of-EUV-based- self-aligned-multipatterning-SAMP-options-targeting/10.1117/12.2515173.short?SSO=1, Mar. 25, 2019, 3 pages.

Drissi et al., Salele Process From Theory to Fabrication, https://www.spiedigitallibrary.org/conference-proceedings-or-spie/10962/2517051/SALELE-process-from-theory-to-fabrication/10.1117/12.2517051.short, Mar. 21, 2019, 3 pages.

(Continued)

*Primary Examiner* — Duy T Nguyen
(74) *Attorney, Agent, or Firm* — TraskBritt

(57) ABSTRACT

A microelectronic device comprises memory cell structures extending from a base material. At least one memory cell structure of the memory cell structures comprises a central portion in contact with a digit line, extending from the base material and comprising opposing arcuate surfaces, an end portion in contact with a storage node contact on a side of the central portion, and an additional end portion in contact with an additional storage node contact on an opposite side of the central portion. Related microelectronic devices, electronic systems, and methods are also described.

33 Claims, 25 Drawing Sheets

(56) References Cited

U.S. PATENT DOCUMENTS

| | | | |
|---|---|---|---|
| 2004/0135190 A1* | 7/2004 | Lindstedt | H01L 27/10885 257/314 |
| 2008/0296666 A1 | 12/2008 | Shinpei | |
| 2009/0194810 A1* | 8/2009 | Kiyotoshi | H10B 41/41 257/E21.546 |
| 2011/0183507 A1 | 7/2011 | Figura et al. | |
| 2011/0198758 A1 | 8/2011 | Jeon et al. | |
| 2016/0300842 A1* | 10/2016 | Tang | H10B 12/0335 |
| 2017/0062324 A1 | 3/2017 | Brown et al. | |
| 2018/0226406 A1* | 8/2018 | Surthi | H01L 21/76897 |
| 2020/0066730 A1* | 2/2020 | Guo | H01L 27/10885 |
| 2020/0105311 A1* | 4/2020 | Pandey | G11C 5/10 |
| 2020/0111673 A1 | 4/2020 | Yang | |
| 2020/0286895 A1* | 9/2020 | Tang | H10B 12/488 |
| 2021/0057418 A1* | 2/2021 | Lee | H01L 21/76897 |
| 2022/0051699 A1* | 2/2022 | Fishburn | H01L 27/10823 |
| 2022/0051700 A1* | 2/2022 | Lee | H01L 27/10888 |

OTHER PUBLICATIONS

Gillijns et al., Impact of a SADP Flow on the Design and Process for N10/N7 Metal Layers, https://www.spiedigitallibrary.org/conference-proceedings-or-spie/9427/942709/Impact-of-a-SADP-flow-on-the-design-and-process/10.1117/12.2085923.short?webSyncID=d268bead-49a2-8531-ab0d-3a6b03c97c00&sessionGUID=9b6bcd74-6b80-d8e8-abee-aed6ae05c117, Mar. 18, 2015, 3 pages.

Lee et al., Multi-Patterning Strategies for Navigating the Sub-5 nm Frontier, Part 3, https://www.ednasia.com/multi-patterning-strategies-for-navigating-the-sub-5-nm-frontier-part-3/, Apr. 20, 2020, 8 pages.

Padmanaban et al., Underlayer and Rinse Materials for Improving EUV Resist Performance, Proceedings of SPIE, vol. 8682, (Mar. 2013), pp. 868215-1-868215-11.

Xu et al., Underlayer Designs to Enhance the Performance of EUV Resists, Proceedings of SPIE, vol. 7273, (2009), pp. 72731J-1-72731J-11.

* cited by examiner

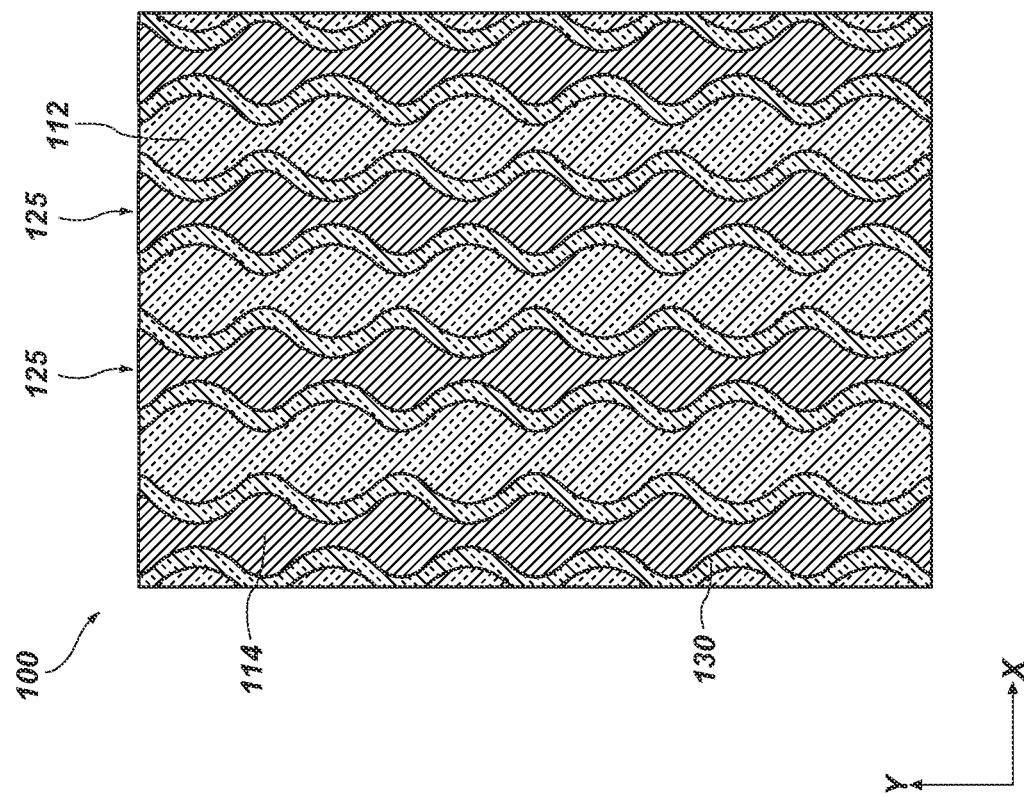
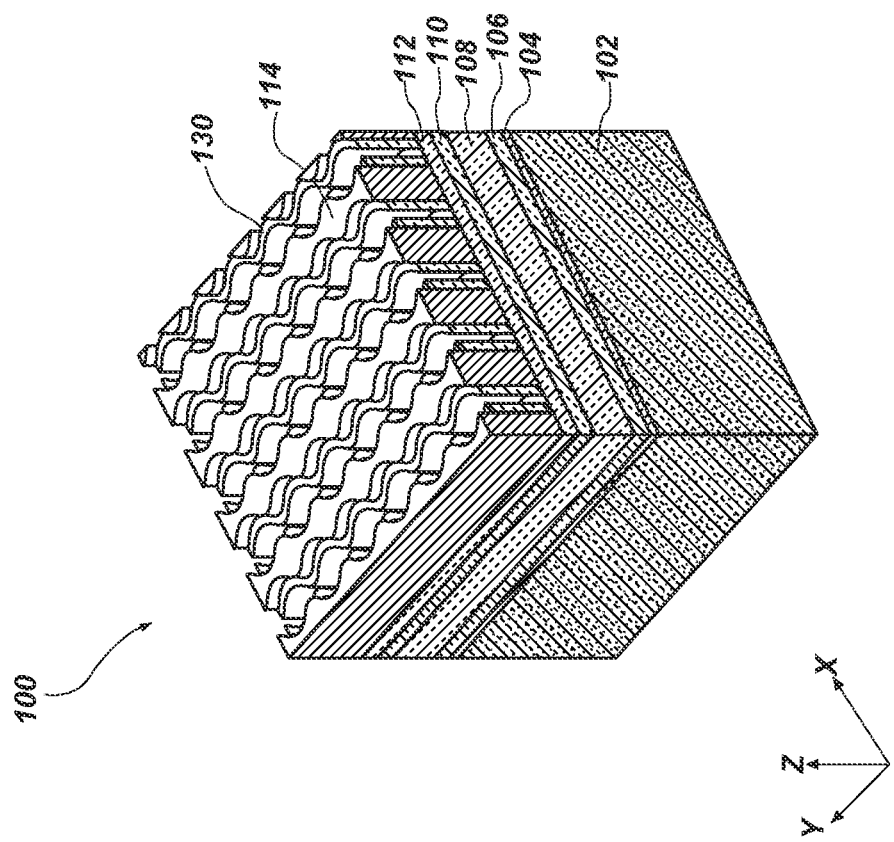
FIG. 1D
FIG. 1C

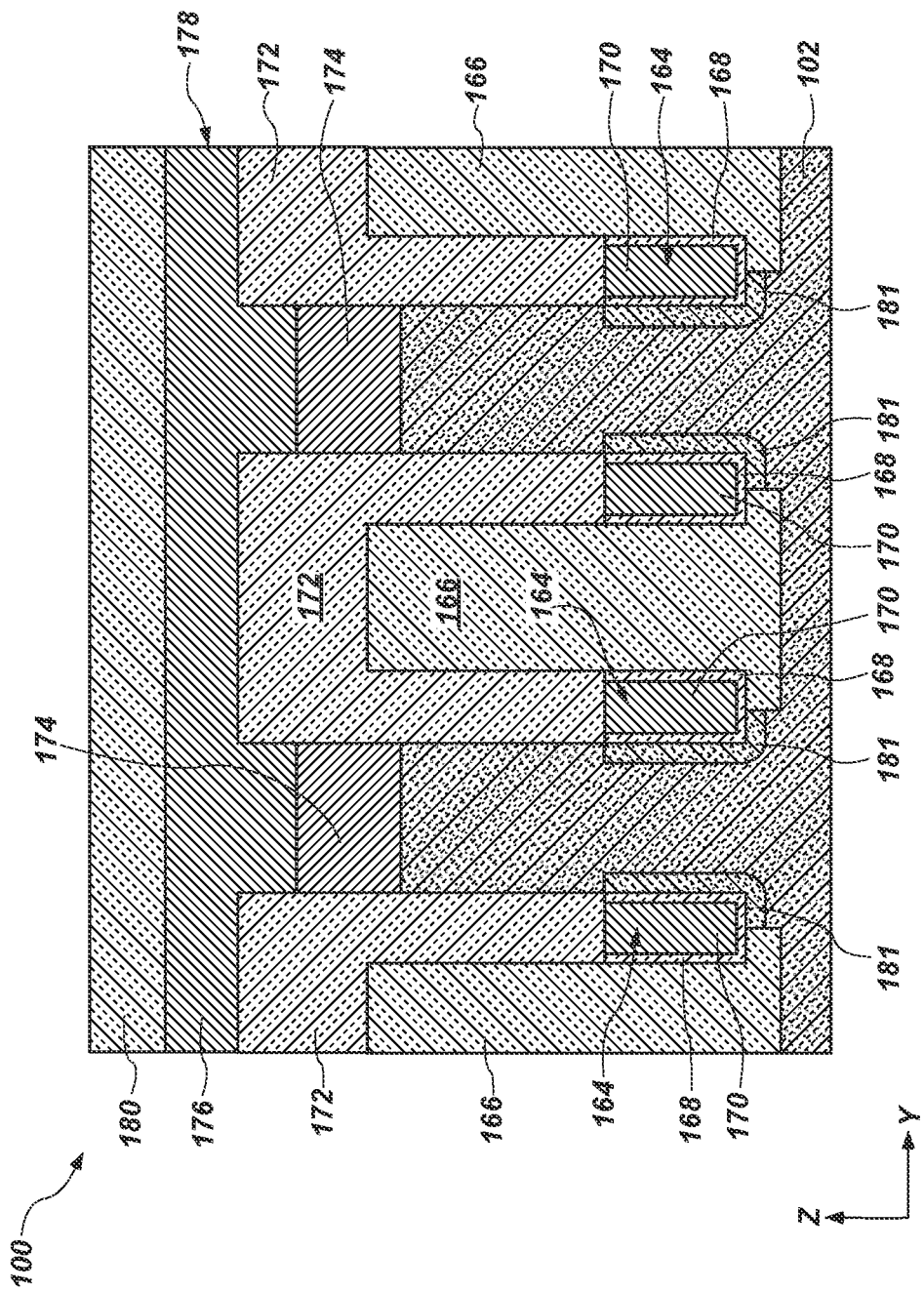

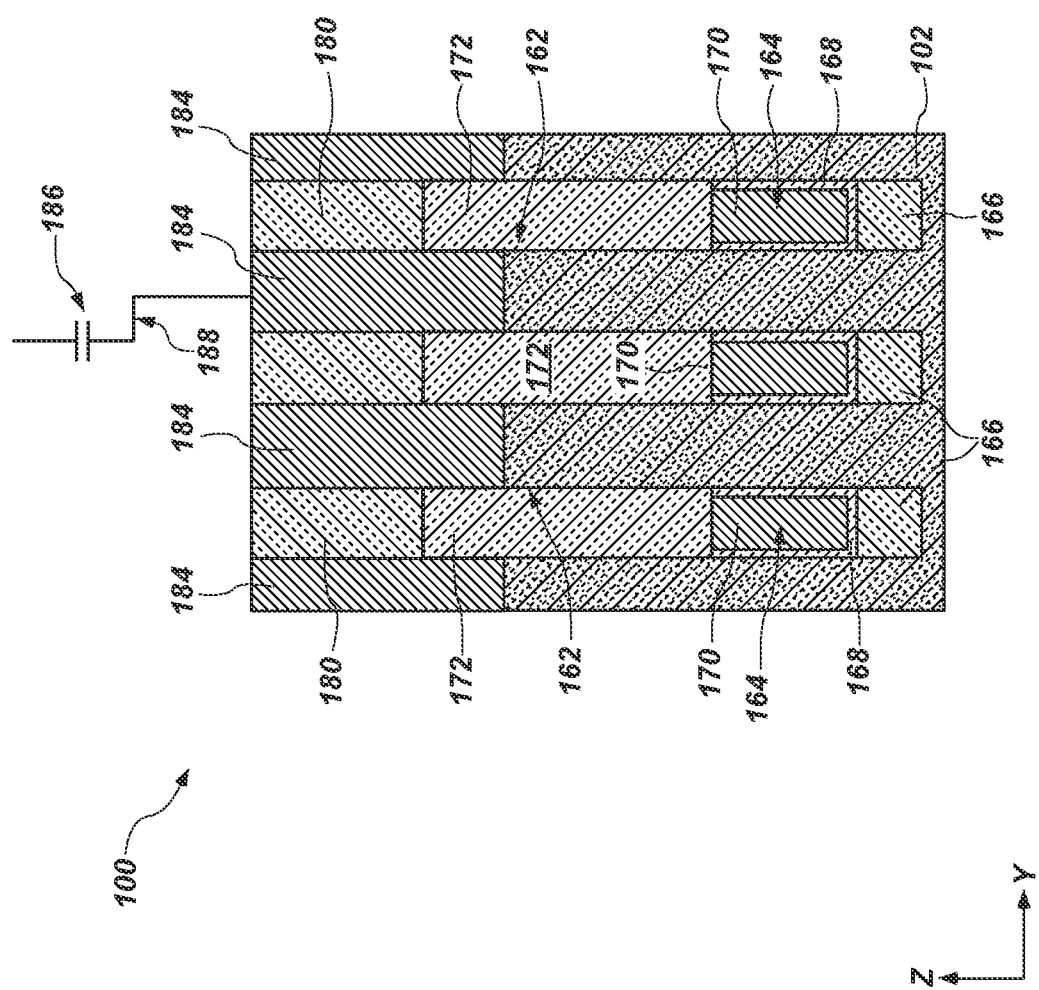

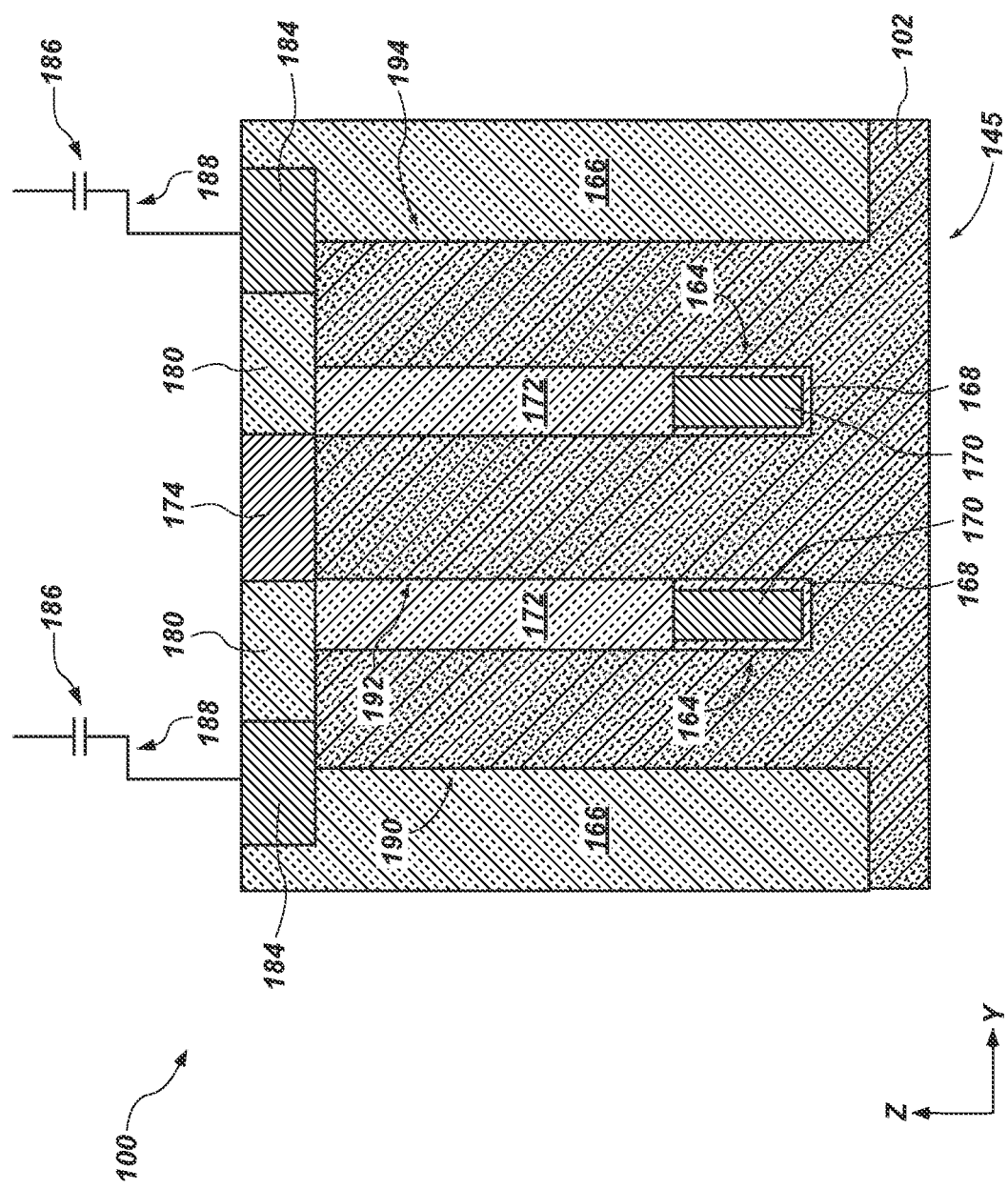

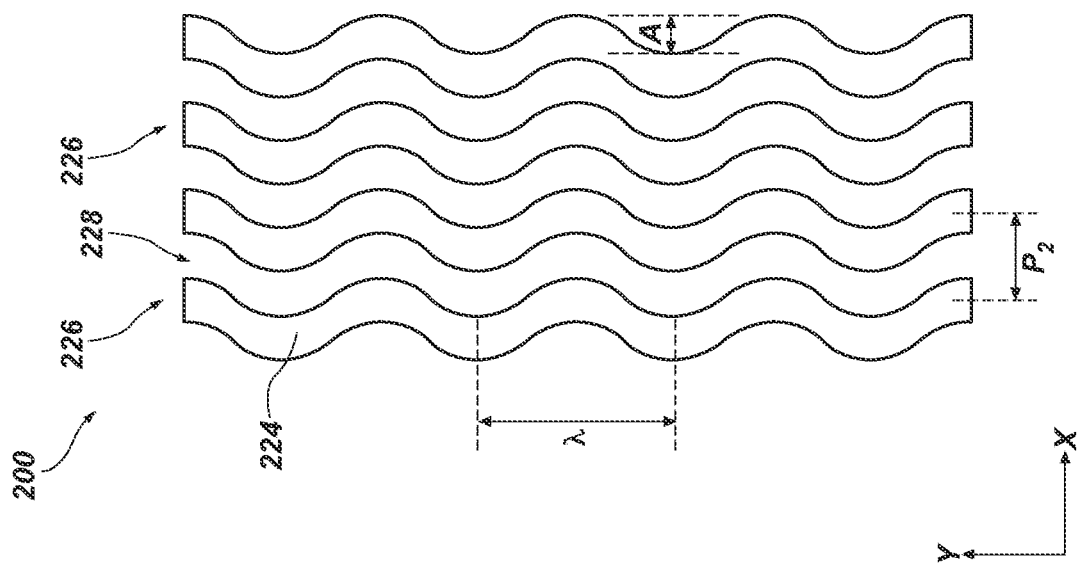
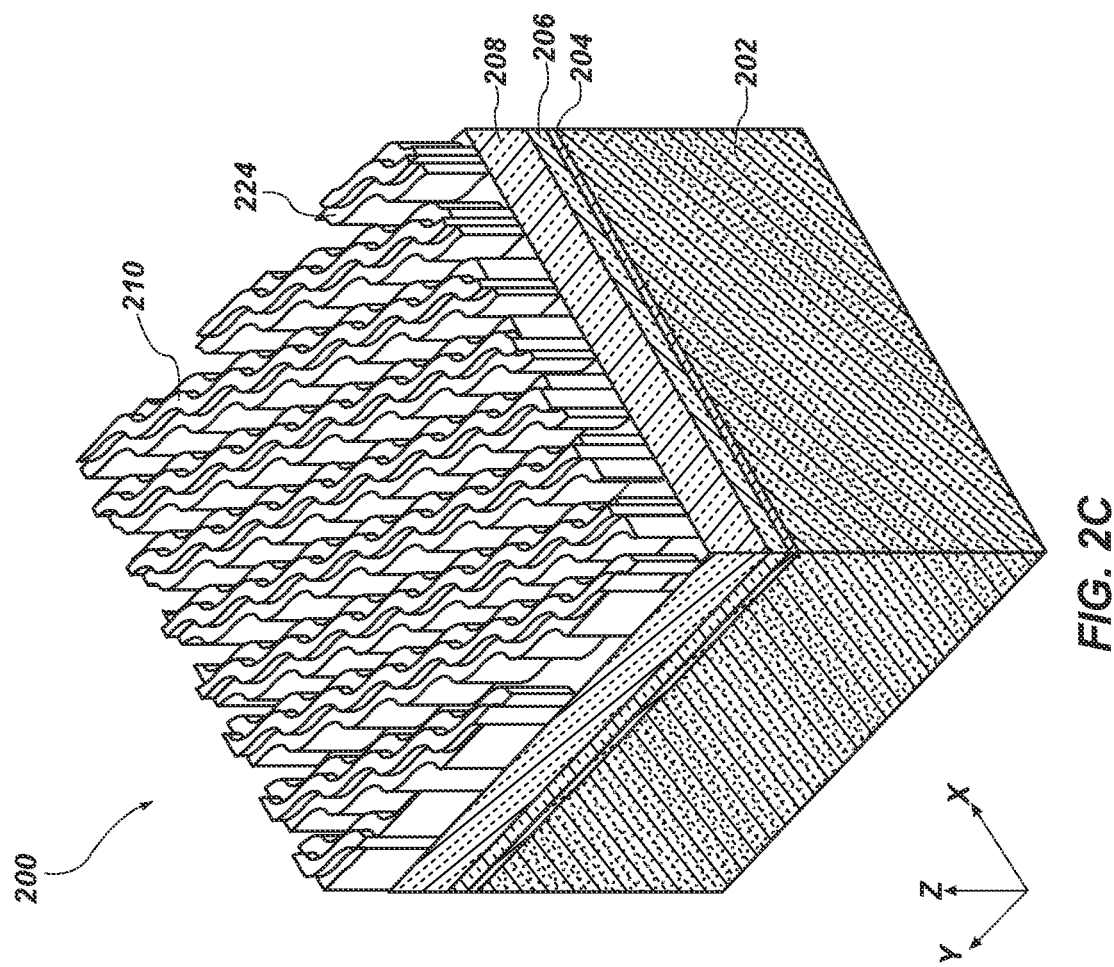

MICROELECTRONIC DEVICES INCLUDING MEMORY CELL STRUCTURES, AND RELATED METHODS AND ELECTRONIC SYSTEMS

TECHNICAL FIELD

The disclosure, in various embodiments, relates generally to the field of microelectronic device design and fabrication. More specifically, the disclosure relates to methods of forming microelectronic devices comprising memory device structures, and to related microelectronic devices and electronic systems.

BACKGROUND

Semiconductor device designers often desire to increase the level of integration or density of features within a semiconductor device by reducing the dimensions of the individual features and by reducing the separation distance between neighboring features, in addition, semiconductor device designers often desire to design architectures that are not only compact, but offer performance advantages, as well as simplified designs.

A relatively common semiconductor device is a memory device. A memory device may include a memory array having a number of memory cells arranged in a grid pattern. One type of memory cell is a dynamic random access memory (DRAM). In the simplest design configuration, a DRAM cell includes one access device, such as a transistor, and one storage device, such as a capacitor. Modern applications for memory devices can utilize vast numbers of DRAM unit cells, arranged in an array of rows and columns. The DRAM cells are electrically accessible through digit lines and word lines arranged along the rows and columns of the array.

Reducing the dimensions and spacing of memory device features places ever increasing demands on the methods used to form the memory device features. For example, one of the limiting factors in the continued shrinking of memory devices is inadvertent shorting between contacts associated with various components of the DRAM cells. As used herein, a "contact" refers to a connection facilitating a conductive pathway between at least two structures. For example, in a DRAM device exhibiting a dual bit memory cell structure, a digit line contact is provided between a digit line and an access device (e.g., a transistor) formed in or above a substrate, and storage node contacts are formed between the access device and a storage node (e.g., a capacitor) where electrical charge may be stored. As the dimensions of the memory device (e.g., DRAM device) features decrease, the packing density of the contacts associated therewith increases, resulting in an increased likelihood of inadvertently shorting various components together, which can adversely affect memory device performance. In some instances, the digit line contact may inadvertently contact the storage node contact, electrically shorting the digit line to the storage node and resulting in failure of the memory cell associated with the storage node.

BRIEF DESCRIPTION OF THE DRAWINGS

FIG. 2A through FIG. 2J are simplified partial perspective views (FIG. 2A, FIG. 2C, and FIG. 2E through FIG. 2H) and simplified partial top-down views (FIG. 2B, FIG. 2D, FIG. 2I, and FIG. 2J) illustrating a method of forming a microelectronic device structure, in accordance with additional embodiments of the disclosure;

DETAILED DESCRIPTION

Figure 1B:
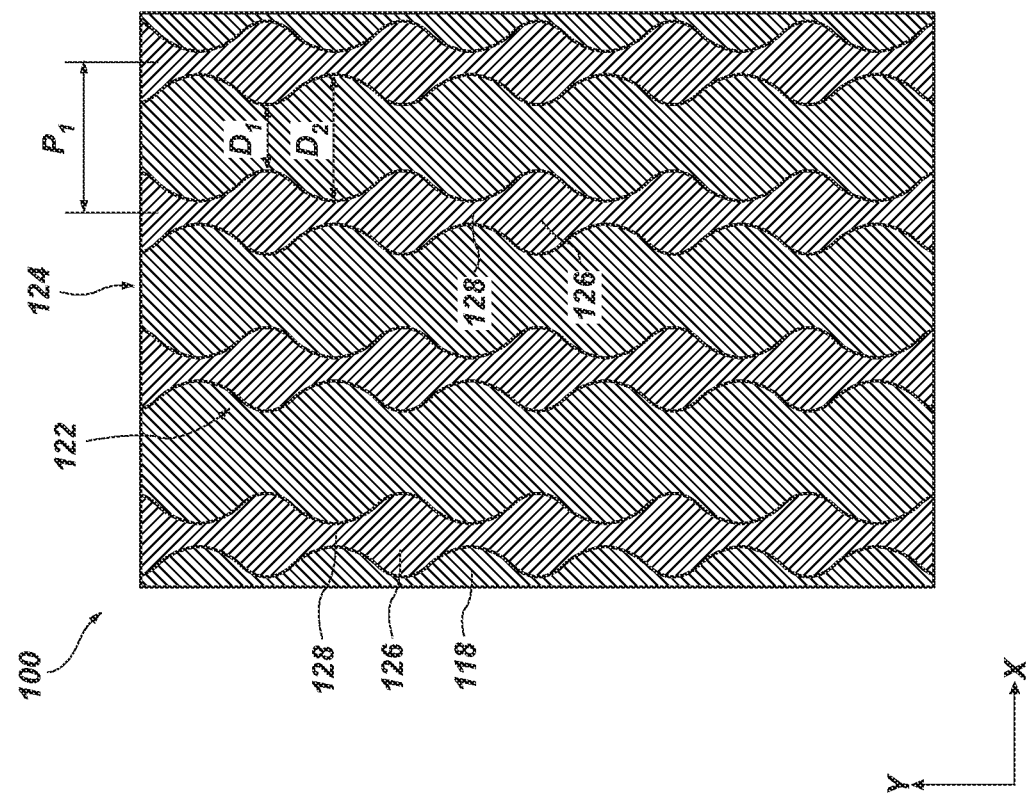
FIG. 1A through FIG. 1S are simplified partial perspective views (FIG. 1A, FIG. 1C, FIG. 1E, FIG. 1G, FIG. 1I, and FIG. 1K through FIG. 1N), simplified partial top-down views (FIG. 1B, FIG. 1D, FIG. 1F, FIG. 1H, FIG. 1J, and FIG. 1O), and simplified partial cross-sectional views (FIG. 1P through FIG. 1S) illustrating a method of forming a microelectronic device structure, in accordance with embodiments of the disclosure.

The illustrations included herewith are not meant to be actual views of any particular systems, microelectronic structures, microelectronic devices, or integrated circuits thereof, but are merely idealized representations that are employed to describe embodiments herein. Elements and features common between figures may retain the same numerical designation except that, for ease of following the description, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing a microelectronic device (e.g., a memory device, such as a DRAM memory device, a 3D NAND Flash memory device) or a complete microelectronic device. The structures described below do not form a complete microelectronic device. Only those process acts and structures necessary to understand the embodiments described herein are described in detail below. Additional acts to form a complete microelectronic device from the structures may be performed by conventional techniques.

The materials described herein may be formed by conventional techniques including, but not limited to, spin coating, blanket coating, chemical vapor deposition (CVD), atomic layer deposition (ALD), plasma enhanced ALD, physical vapor deposition (PVD), plasma enhanced chemical vapor deposition (PECVD), or low pressure chemical vapor deposition (LPCVD). Alternatively, the materials may be grown in situ. Depending on the specific material to be formed, the technique for depositing or growing the material may be selected by a person of ordinary skill in the art. The removal of materials may be accomplished by any suitable technique including, but not limited to, etching, abrasive planarization (e.g., chemical-mechanical planarization), or other known methods unless the context indicates otherwise.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "longitudinal," "vertical," "lateral," and "horizontal" are in reference to a major plane of a substrate (e.g., base material, base structure, base construction, etc.) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped, etc.) and the spatially relative descriptors used herein interpreted accordingly.

As used herein, features (e.g., regions, materials, structures, devices) described as "adjacent" one another means and includes features of the disclosed identity (or identities) that are located most proximate (e.g., closest to, neighboring) one another. Additional features (e.g., additional regions, additional materials, additional structures, additional devices) not matching the disclosed identity (or identities) of the "adjacent" features may be disposed between the "adjacent" features. Put another way, the "adjacent" features may be positioned directly neighboring one another, such that no other feature intervenes between the "adjacent" features; or the "adjacent" features may be positioned indirectly adjacent one another, such that at least one feature having an identity other than that associated with at least one the "adjacent" features is positioned between the "adjacent" features. Accordingly, features described as "vertically adjacent" one another means and includes features of the disclosed identity (or identities) that are located most vertically proximate (e.g., vertically closest to, vertically neighboring) one another. Moreover, features described as "horizontally adjacent" one another means and includes features of the disclosed identity (or identities) that are located most horizontally proximate (e.g., horizontally closest to, horizontally neighboring) one another.

As used herein, the term "memory device" means and includes microelectronic devices exhibiting memory functionality, but not necessarily limited to memory functionality. Stated another way, and by way of example only, the term "memory device" means and includes not only conventional memory (e.g., conventional volatile memory, such as conventional dynamic random access memory (DRAM); conventional non-volatile memory, such as conventional NAND memory), but also includes an application specific integrated circuit (ASIC) (e.g., a system on a chip (SoC)), a microelectronic device combining logic and memory, and a graphics processing unit (GPU) incorporating memory.

As used herein, "conductive material" means and includes an electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including a conductive material.

As used herein, "insulative material" means and includes an electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $NbO_x$, $TiO_x$, $SiN_y$, $SiO_xN_y$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including the insulative material.

As used herein, a "selectively removable" material means and includes a material that exhibits a greater removal rate responsive to process conditions, such as exposure to radiation (e.g., heat), relative to another material exposed to the same process conditions. A material that is selectively removable relative to another material is substantially completely removable without substantially removing the another material (e.g., without removing substantially any of the another material).

As used herein, a "selectively etchable" material means and includes a material that exhibits a greater etch rate responsive to exposure to a given etch chemistry and/or process conditions relative to another material exposed to the same etch chemistry and/or process conditions. For example, the material may exhibit an etch rate that is at least about five times greater than the etch rate of another material, such as an etch rate of about ten times greater, about twenty times greater, or about forty times greater than the etch rate of the another material. Etch chemistries and etch conditions for selectively etching a desired material may be selected by a person of ordinary skill in the art.

According to embodiments described herein, a microelectronic device includes isolated memory cell structures (e.g., isolated elongate semiconductive pillar structures having a larger length than a width thereof), each of the memory cell structures individually including a digit line contact region laterally disposed between two storage node contact regions. The digit line contact region may be in electrical communication with a digit line contact that is, in turn, in electrical communication with a digit line extending in a first lateral direction. Each of the storage node contact regions is individually in electrical communication with a storage node contact, each of which is in electrical communication with a storage node (e.g., a capacitor, which may also be referred to herein as a cell capacitor). Each memory cell structure may include a central portion including the digit line contact region, a first end portion at a first end of the central portion, and a second end portion at a second, opposite end of the central portion. The first end portion includes a first one of the storage node contact regions and the second end portion includes a second one of the storage node contact regions. The central portion may extend in the first lateral direction and include a longitudinal axis substantially parallel with the digit line. In other words, the central portion may be elongated in a direction in which the digit line extends. In some embodiments, each of the first end portion and the second end portion includes a longitudinal axis that is oriented at an angle with respect to the longitudinal axis of the central portion. Stated another way, each of the first end portion and the second end portion extends at an angle with respect to the central portion. In some embodiments, the central portion includes opposing arcuate surfaces. In other embodiments, the central portion includes opposing substantially parallel surfaces. In some embodiments, each of the first end portion and the second end portion individually includes opposing substantially linear surfaces. In other embodiments, the first end portion and the second end portion each individually include at least one arcuate surface and at least one substantially linear surface. In some such embodiments, the at least one arcuate surface may be opposite the at least one linear surface. In some embodiments, the memory cell structures exhibit a so-called "S" shape. In other embodiments, the memory cell structures exhibit a so-called "Z" shape. The shape of the memory cell structures may depend, at least in part, on the method of forming the memory cell structures.

Orienting the first end portion and the second end portion at an angle with respect to the central portion facilitates an increased distance between the storage node contact regions and the digit line contact region of the memory cell structure, reducing a likelihood of inadvertent shorting between such features compared to conventional microelectronic devices. In addition, orienting the first end portion and the second end portion at an angle with respect to the central portion facilitates an increased active area of the memory cell structures (e.g., an increased active area for the bit line contacts and each of the storage node contacts). Further, forming the end portions at an angle with respect to the central portion may facilitate an increased area (e.g., a greater margin) for formation of the digit line contact on the digit line contact region. In some embodiments, the shape of the memory cell structures may reduce (e.g., eliminate) an overlap between word line structures and the digit line contact regions of the memory cell structures compared to conventional memory cell structures. In some embodiments, forming the first end portion and the second end portion at an angle with respect to the central portion may facilitate increased mechanical stability (and a reduction in toppling) of pillars of the memory cell structures compared to pillars of conventional memory cell structures exhibiting a linear shape. In some embodiments, the size and shape of the memory cell structures facilitates an improved overlay margin, better operation of the memory cells associated with the memory cell structures (e.g., improved reading and writing operations of the memory cells), and improved yield of the memory cell structures during formation of the microelectronic device. In addition, the memory cell structures may be formed without using so-called pitch quadrupling techniques.

In some embodiments, the isolated memory cell structures are formed using extreme ultraviolet lithography (EUV). Extreme ultraviolet lithography may facilitate forming the isolated memory cell structures at a smaller pitch and spacing compared to memory cell structures of conventional microelectronic devices and without use of pitch quadrupling techniques.

Figure 1A:
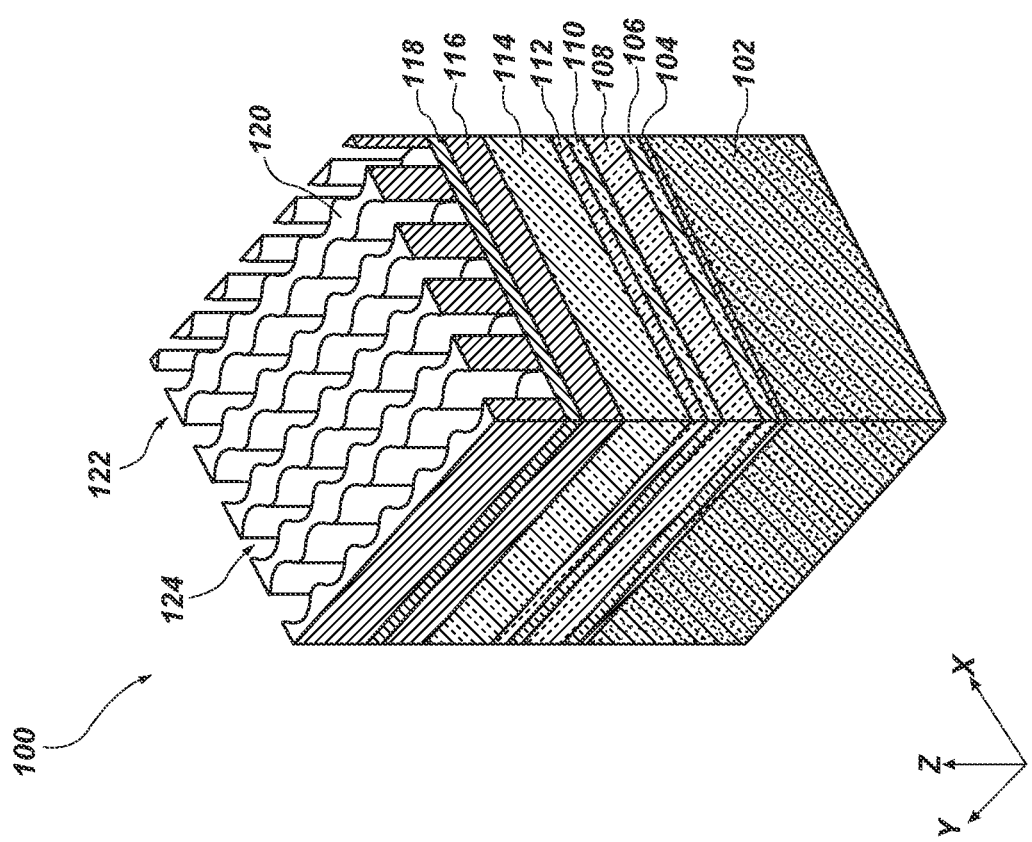

FIG. 1A through FIG. 1S include simplified partial perspective views (FIG. 1A, FIG. 1C, FIG. 1E, FIG. 1G, FIG. 1I, and FIG. 1K through FIG. 1N), simplified partial top-down views (FIG. 1B, FIG. 1D, FIG. 1F, FIG. 1H, FIG. 1J, and FIG. 1O), and simplified partial cross-sectional views (FIG. 1P through FIG. 1S) illustrating a method of forming a microelectronic device structure (e.g., a memory device structure, such as a DRAM device structure) for a microelectronic device (e.g., a memory device, such as a DRAM device), in accordance with embodiments of the disclosure. With the description provided below, it will be readily apparent to one of ordinary skill in the art that the methods described herein may be used in various devices. In other words, the methods of the disclosure may be used whenever it is desired to form a microelectronic device including the memory cell structures.

FIG. 1A is a simplified partial perspective view of a microelectronic device 100 and FIG. 1B is a partial simplified top-down view of the microelectronic device 100. Referring to FIG. 1A, the microelectronic device 100 includes a base material 102, a first oxide material 104 vertically (e.g., in the Z-direction) overlying the base material 102, a hard mask material 106 vertically overlying the first oxide material 104, a second oxide material 108 vertically overlying the hard mask material 106, a first sacrificial material 110 vertically overlying the second oxide material 108, a third oxide material 112 vertically overlying the first sacrificial material 110, a second sacrificial material 114 vertically overlying the third oxide material 112, a carbon-containing material 116 vertically overlying the second sacrificial material 114, a dielectric anti-reflective coating (DARC) material 118 vertically overlying the carbon-containing material 116, and a photoresist material 120 (also referred to herein as a "photomask material") vertically overlying the DARC material 118.

The photoresist material 120 may be arranged in lines 122 spaced from each other by first trenches 124. In some embodiments, the lines 122 may each individually exhibit a weave shape including widened rounded portions 126 (also referred to herein as "bubble portions") spaced from each other by narrower curved portions 128 having a smaller width (e.g., in the X-direction) than a width of the widened rounded portions 126. For clarity and ease of understanding the description, portions of the photoresist material 120 are not illustrated in cross-hatching in FIG. 1A. Throughout the drawings, in some partial perspective views, portions of a material may not be illustrated with cross-hatching for clarity and ease of understanding the description and drawings.

In some embodiments, a pitch $P_1$ of the lines 122 may be within a range from about 40 nanometers (nm) to about 60 nm, such as from about 40 nm to about 50 nm, or from about 50 nm to about 60 nm. However, the disclosure is not so limited and the pitch $P_1$ may be different than those described.

In some embodiments, a distance $D_1$ between the widened rounded portions 126 of neighboring lines 122 may be within a range from about 10 nm to about 30 nm, such as from about 10 nm to about 20 nm, or from about 20 nm to about 30 nm. In some embodiments, a distance $D_2$ between the narrow curved portions 128 of neighboring lines 122 may be within a range from about 20 nm to about 40 nm, such as from about 20 nm to about 30 nm, or from about 30 nm to about 40 nm.

The base material 102 may include a semiconductor substrate, a base semiconductor material on a supporting substrate, a metal electrode, or a semiconductor substrate having one or more materials, structures, or regions formed thereon. The base material 102 may comprise a semiconductive material, such as a conventional silicon substrate or other bulk substrate including semiconductor material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form materials, regions, or junctions in the base semiconductor structure or foundation. The base material 102 may include one or more materials associated with integrated circuitry fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

The first oxide material 104 may be formed of and include one or more dielectric materials, such as, for example, one or more of silicon dioxide ($SiO_2$), fluorosilicate glass (FSG), phosphosilicate glass (PSG), borosilicate glass (BSG), borophosphosilicate glass (BPSG), and another insulative material. The first oxide material 104 may be formed by thermal oxidation of the base material 102, deposition (e.g., deposition with, for example, tetraethyl orthosilicate (TEOS)), or another method. In some embodiments, the first oxide material 104 comprises silicon dioxide.

The hard mask material 106 may be formed of and include one or more materials exhibiting an etch selectivity to various mask materials (e.g., chop masks), as will be described herein. By way of non-limiting example, the hard mask material 106 may exhibit an etch selectivity with respect to various materials, such as sacrificial materials (e.g., amorphous carbon), dielectric materials (e.g., silicon dioxide, silicon nitride), a dielectric anti-reflective coating (DARC) material, and a bottom anti-reflective coating (BARC) material. The hard mask material 106 may be formed of and include one or more of a metal nitride (e.g., titanium nitride, tungsten nitride, tantalum nitride, aluminum nitride), a metal oxide (e.g., aluminum oxide, titanium oxide, tungsten oxide, tantalum oxide, hafnium oxide, zirconium oxide), an oxynitride material, a silicon oxycarbide, a silicon carboxynitride material, amorphous carbon, or another material. In some embodiments, the hard mask material 106 comprises titanium nitride.

The second oxide material 108 may be formed of and include one or more of the materials described above with reference to the first oxide material 104. In some embodiments, the second oxide material 108 comprises substantially the same material composition as the first oxide material 104. In other embodiments, the second oxide material 108 comprises a different material composition than the first oxide material 104. In some embodiments, the second oxide material 108 comprises silicon dioxide.

The first sacrificial material 110 may be formed of and include one or more of amorphous silicon (α-silicon), silicon nitride ($Si_3N_4$), silicon oxynitride ($SiO_xN_y$), or another material. In some embodiments, the first sacrificial material 110 comprises silicon-amorphous silicon.

The third oxide material 112 may be formed of and include one or more of the materials described above with reference to the first oxide material 104. In some embodiments, the third oxide material 112 comprises substantially the same material composition as the first oxide material 104. In other embodiments, the third oxide material 112 comprises a different material composition than the first oxide material 104. In some embodiments, the third oxide material 112 comprises silicon dioxide.

The second sacrificial material 114 may be formed of and include one or more of the materials described above with reference to the first sacrificial material 110. In some embodiments, the second sacrificial material 114 comprises substantially the same material composition as the first sacrificial material 110. In other embodiments, the second sacrificial material 114 comprises a different material composition than the first sacrificial material 110. In some embodiments, the second sacrificial material 114 comprises amorphous silicon.

The carbon-containing material 116 may be formed of and include a carbon-containing mask material. In some embodiments, the carbon-containing material 116 comprises amorphous hydrogenated carbon (also referred to as "amorphous carbon"). In some embodiments, the carbon-containing material 116 comprises a spin-on carbon (SOC) material.

The DARC material 118 may be formed of and include a silicon oxynitride material, such as $Si_xO_yN_z$, wherein x is between about 10 and about 60, y is between about 20 and about 50, and z is between about 10 and about 20. However, the disclosure is not so limited and the DARC material 118 may include other suitable DARC materials that are known in the art. The DARC material 118 may be formulated and configured to substantially prevent reflection of electromagnetic radiation (e.g., a light source) during exposure of a photoresist material (e.g., the photoresist material 120) during patterning of the photoresist material.

The photoresist material 120 may be formed of and include an extreme ultraviolet (EUV) photoresist material. By way of non-limiting example, the photoresist material 120 may be formed of and include a stack comprising alternating levels of silicon and molybdenum. However, the disclosure is not so limited and the photoresist material 120 may include one or more other materials.

With reference to FIG. 1C and FIG. 1D, the pattern of the lines 122 (FIG. 1A, FIG. 1B) of the photoresist material 120 (FIG. 1A, FIG. 1B) may be transferred to the second sacrificial material 114 through the DARC material 118 (FIG. 1A) and the carbon-containing material 116 (FIG. 1A) to form first lines 125. Spacers 130 may be formed on sidewalls of the first lines 125 of the second sacrificial material 114. In some embodiments, the DARC material 118 and the carbon-containing material 116 may be patterned through the trenches 124 (FIG. 1A, FIG. 1B) to form the first lines 125 within the DARC material 118 and the carbon-containing material 116. After forming the first lines 125 within the DARC material 118 and the carbon-containing material 116, the photoresist material 120 may be removed (e.g., stripped) from the microelectronic device 100. In some embodiments, the first lines 125 are formed by a pitch doubling process.

With continued reference to FIG. 1C and FIG. 1D, the second sacrificial material 114 may be patterned through the DARC material 118 and the carbon-containing material 116 to form the first lines 125 of the second sacrificial material 114. In some embodiments, the first lines 125 of the second sacrificial material 114 may have a smaller dimension than the lines 122 (FIG. 1A, FIG. 1B) of the photoresist material 120 (FIG. 1A, FIG. 1B). For example, in some embodiments, the photoresist material 120 may be exposed to a trimming process prior to transferring the pattern to the DARC material 118 and the carbon-containing material 116.

The spacers 130 may be formed of and include one or more materials formulated and configured to exhibit an etch selectivity with respect to the second sacrificial material 114 and the third oxide material 112. By way of non-limiting example, the spacers 130 may be formed of and include a carbon-containing material (e.g., silicon carbon nitride (SiCN)), an oxynitride material (e.g., silicon oxynitride, silicon carboxynitride (SiOCN)), or another material. In some embodiments, since the spacers 130 are formed on sidewalls of the second sacrificial material 114, the spacers 130 may exhibit a shape corresponding to the shape of the sidewalls of the second sacrificial material 114.

Figure 1F:
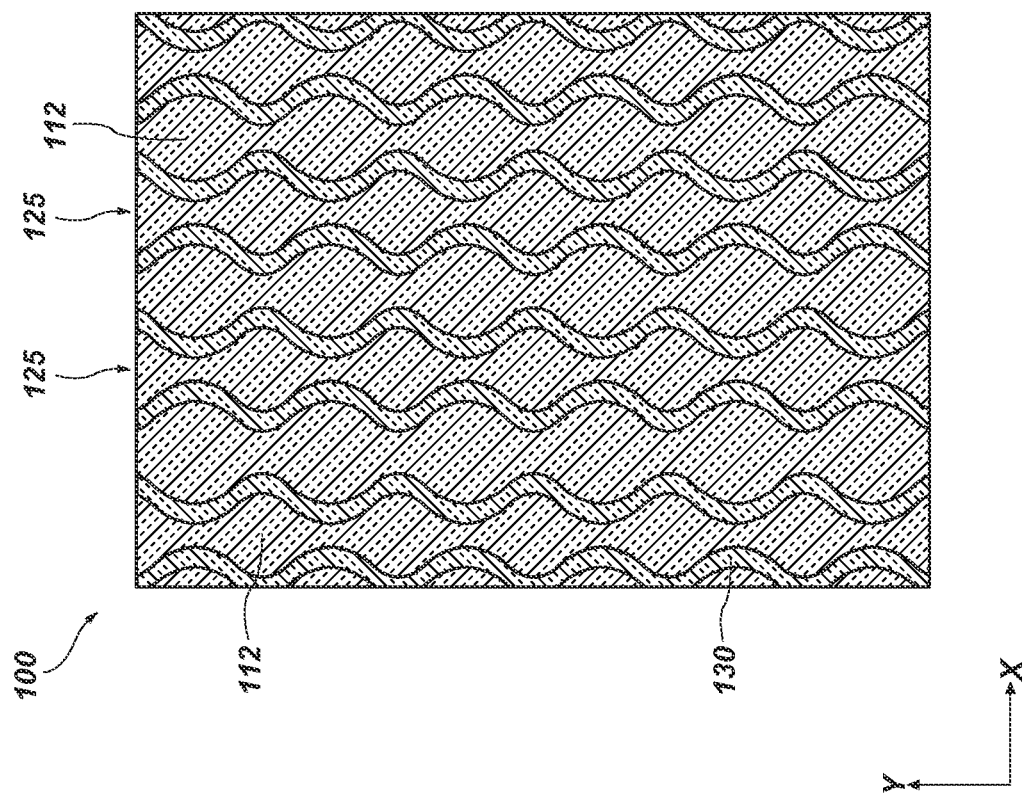
Figure 1E:
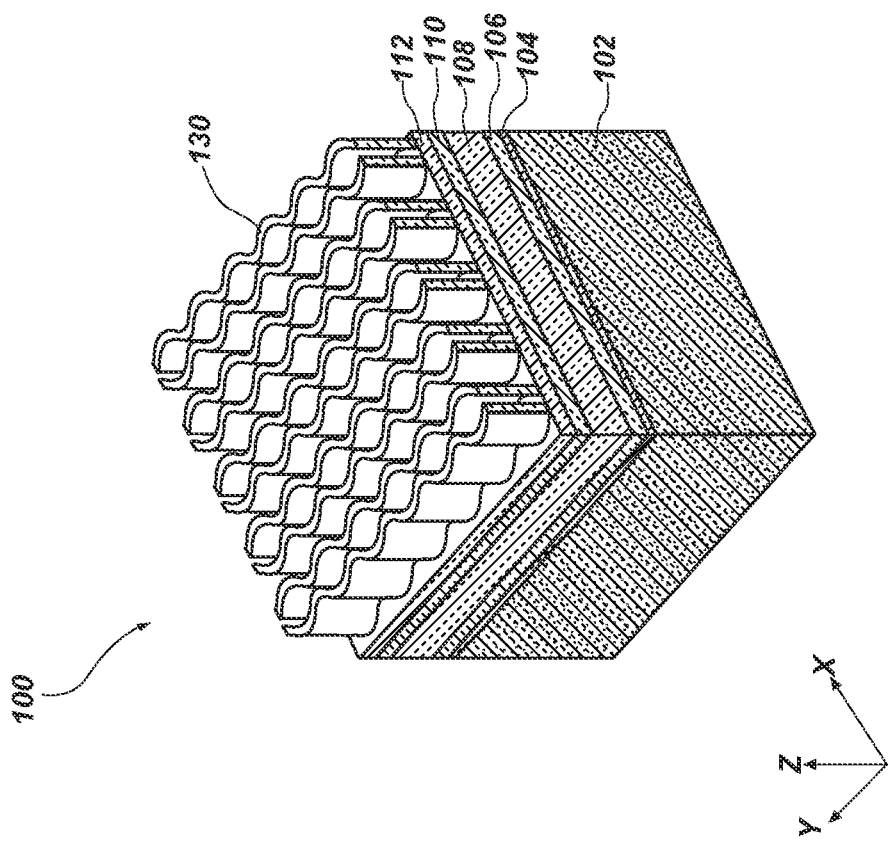

FIG. 1E is a simplified partial perspective view of the microelectronic device 100 and FIG. 1F is a simplified partial top-down view of the microelectronic device 100 of FIG. 1E. With reference to FIG. 1E and FIG. 1F, the second sacrificial material 114 (FIG. 1C, FIG. 1D) may be selectively removed from the microelectronic device 100 while the spacers 130 remain over the third oxide material 112.

Figure 1H:
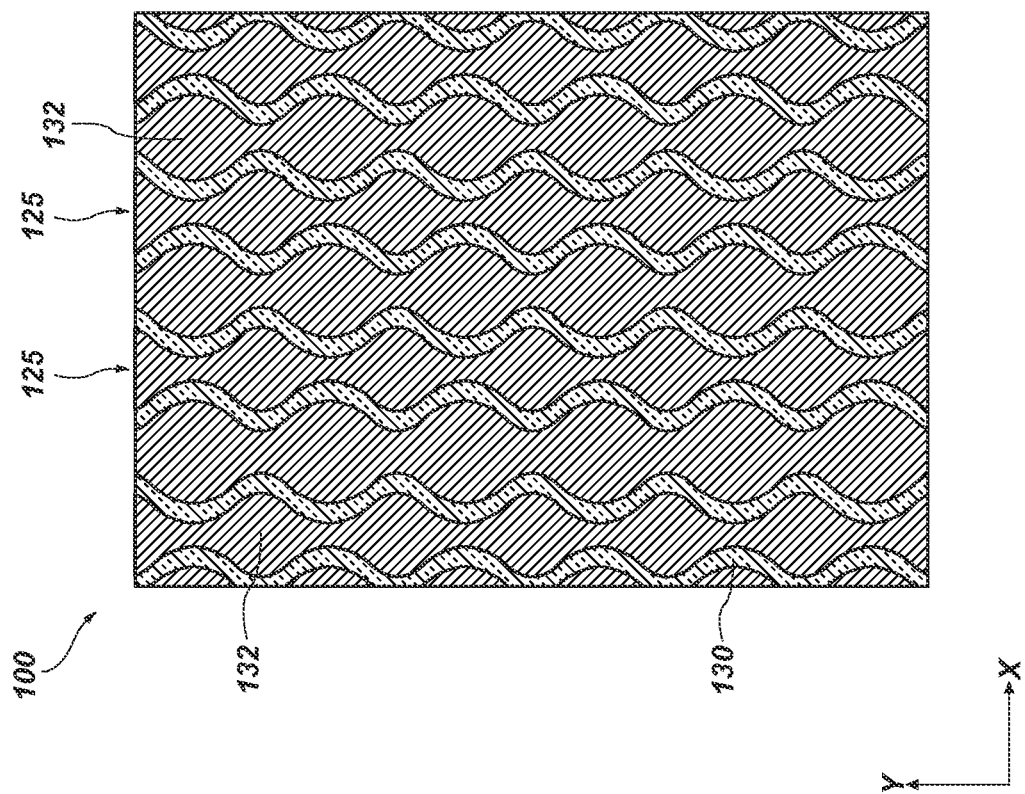
Figure 1G:
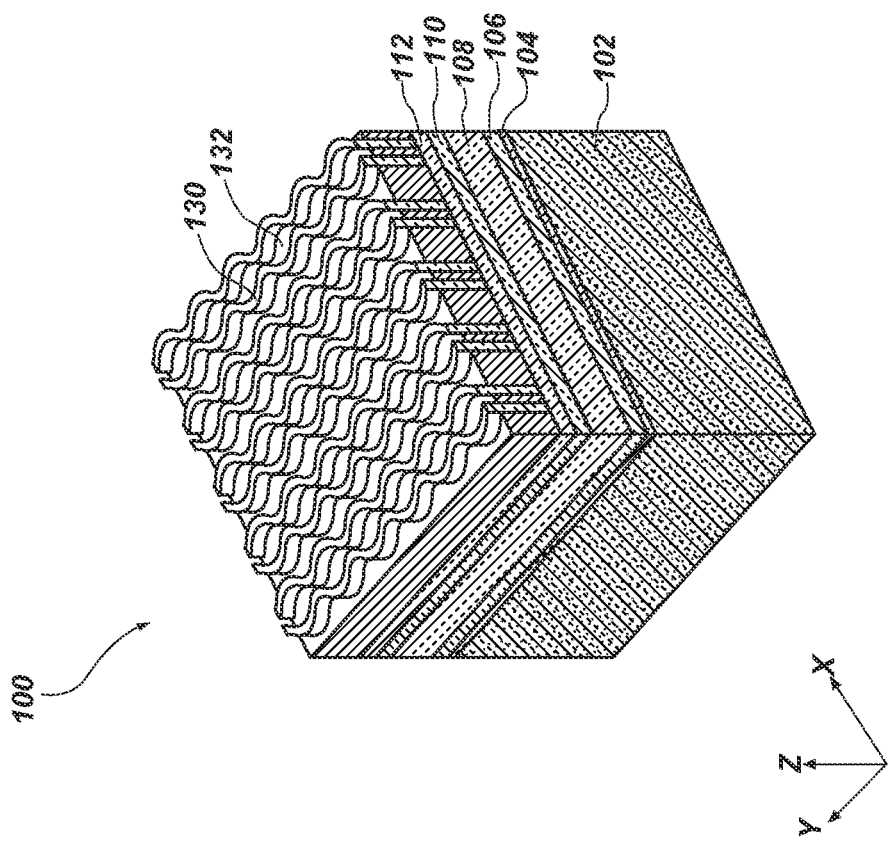

Referring now to FIG. 1G and FIG. 1H, an underlayer material 132 may be formed between laterally neighboring (e.g., in the X-direction) spacers 130 and over the third oxide material 112. The underlayer material 132 may substantially fill spaces between the spacers 130. In some embodiments, after forming the underlayer material 132, the underlayer material 132 may be exposed to a planarization process, such as a chemical mechanical planarization (CMP) process. In other embodiments, the underlayer material 132 may not be exposed to a planarization process.

The underlayer material 132 may be formed of and include one or more of EUV underlayer materials, such as, for example, a polymer matrix material (e.g., a crosslinkable polymer matrix material). By way of non-limiting example, the underlayer material 132 may include one or more of methacrylate, polyhydroxy styrene (PHS), triphenylsulfonium (TPS) triflate, an oxide, a metal (e.g., hafnium, cobalt, tungsten, titanium), a conductive metal nitride (e.g., titanium nitride), a silicide (e.g., titanium silicide, cobalt silicide), a dielectric material (e.g., silicon dioxide, silicon nitride, silicon oxynitride), amorphous carbon, or an anti-reflective material. In some embodiments, the underlayer material 132 comprises spin-on carbon (SOC).

Figure 1J:
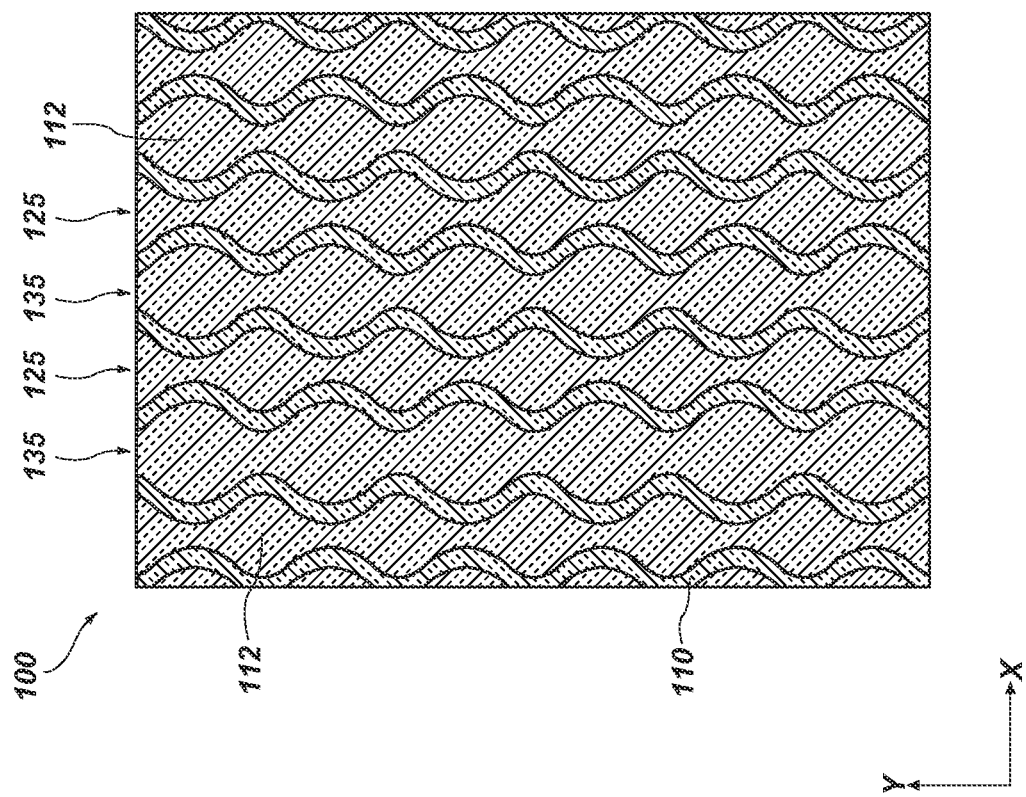
Figure 1I:
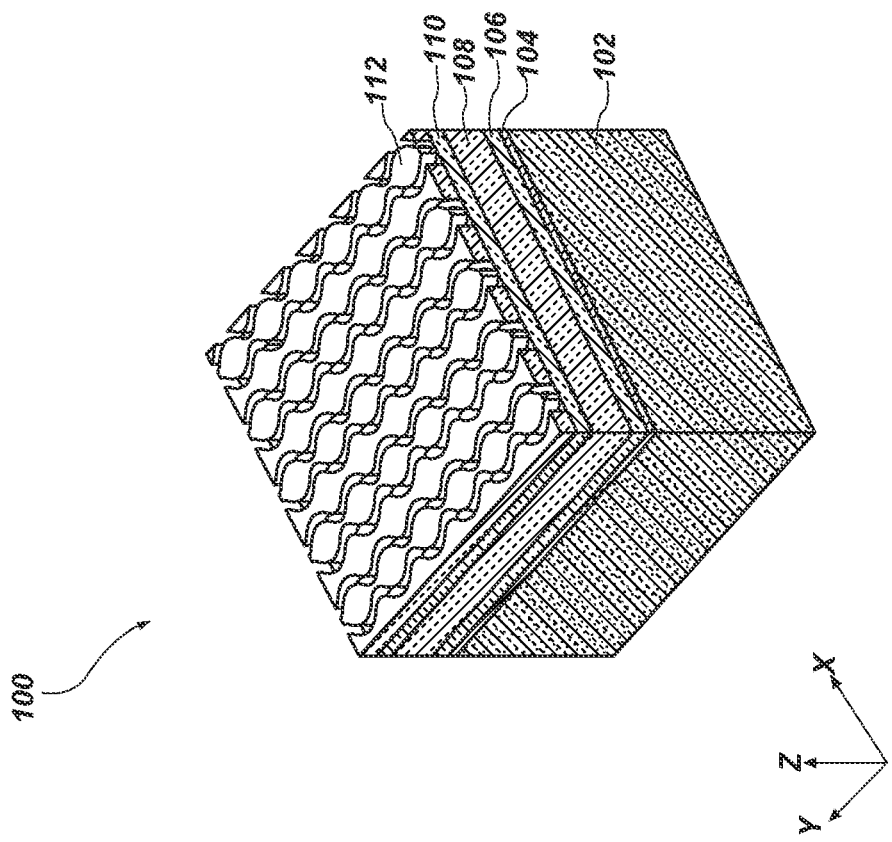

With reference to FIG. 1I and FIG. 1J, after forming the underlayer material 132 (FIG. 1G, FIG. 1H), the spacers 130 (FIG. 1G, FIG. 1H) may be selectively removed from the microelectronic device 100 relative to the underlayer material 132 while the underlayer material 132 remains vertically (e.g., in the Z-direction) over the third oxide material 112. After removal of the spacers 130, the third oxide material 112 may be patterned through the underlayer material 132 to transfer the pattern of the first lines 125 to the third oxide material 112 and to form second lines 135 between laterally (e.g., in the X-direction) neighboring first lines 125. The second lines 135 may be formed at locations corresponding to regions between laterally neighboring lines 122 (FIG. 1A, FIG. 1B) of the photoresist material 120 (FIG. 1A, FIG. 1B). The location of the first lines 125 may correspond to the location of the lines 122 of the photoresist material 120.

The spacers 130 may be selectively removed by, for example, exposing the microelectronic device 100 to one or more etchants. By way of non-limiting example, the spacers 130 may be removed by exposing the spacers 130 to one or more of oxygen ($O_2$), nitrous oxide ($N_2O$), nitrogen trifluoride ($NF_3$), nitrogen dioxide ($NO_2$), or another material.

After forming the first lines 125 and the second lines 135 in the third oxide material 112, the underlayer material 132 (FIG. 1G, FIG. 1H) may be selectively removed from the microelectronic device 100. In some embodiments, the underlayer material 132 is removed by ashing. By way of non-limiting example, the underlayer material 132 may be exposed to a plasma including one or more of hydrogen ($H_2$), nitrogen ($N_2$), fluorine ($F_2$), sulfur hexafluoride ($SF_6$), hexafluoroethane ($C_2F_6$), or another material. In other embodiments, the underlayer material 132 is exposed to one or more other dry etchants, such as, for example, a plasma of one or more of oxygen, nitrogen, a fluorine-containing gas (e.g., nitrogen trifluoride ($NF_3$), sulfur hexafluoride ($SF_6$), carbon tetrafluoride ($CF_4$)), hydrogen bromide (HBr), to selectively remove the underlayer material 132.

Figure 1L:
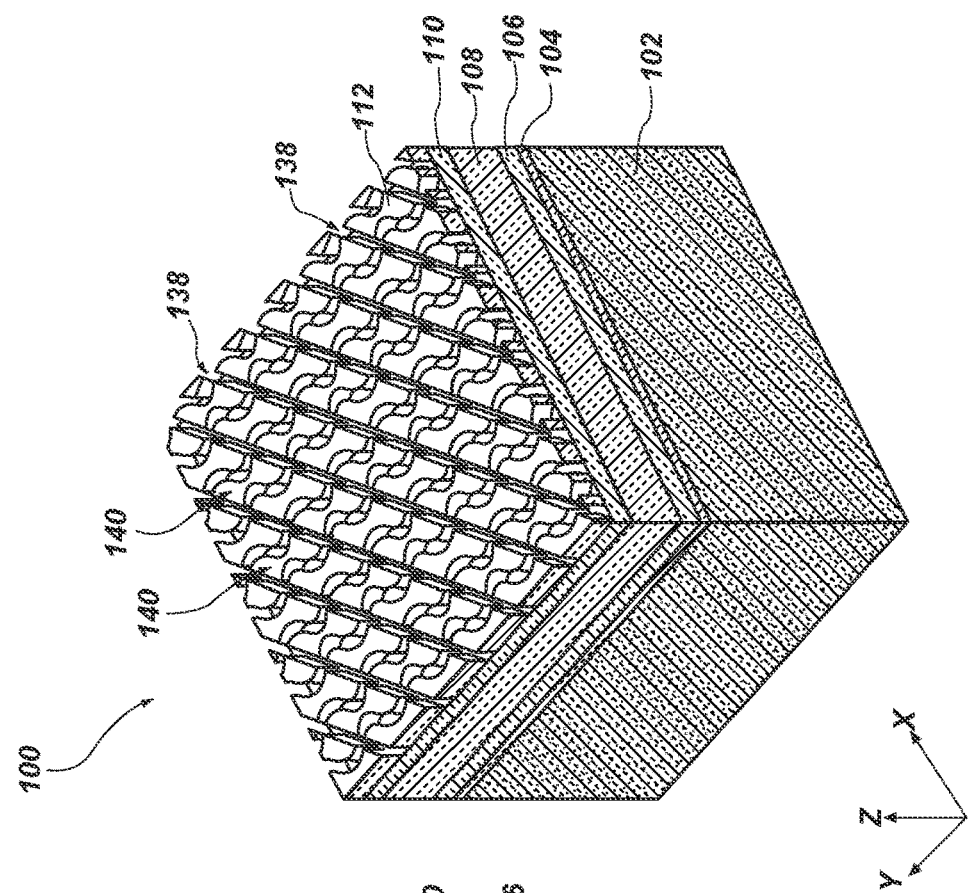
Figure 1K:
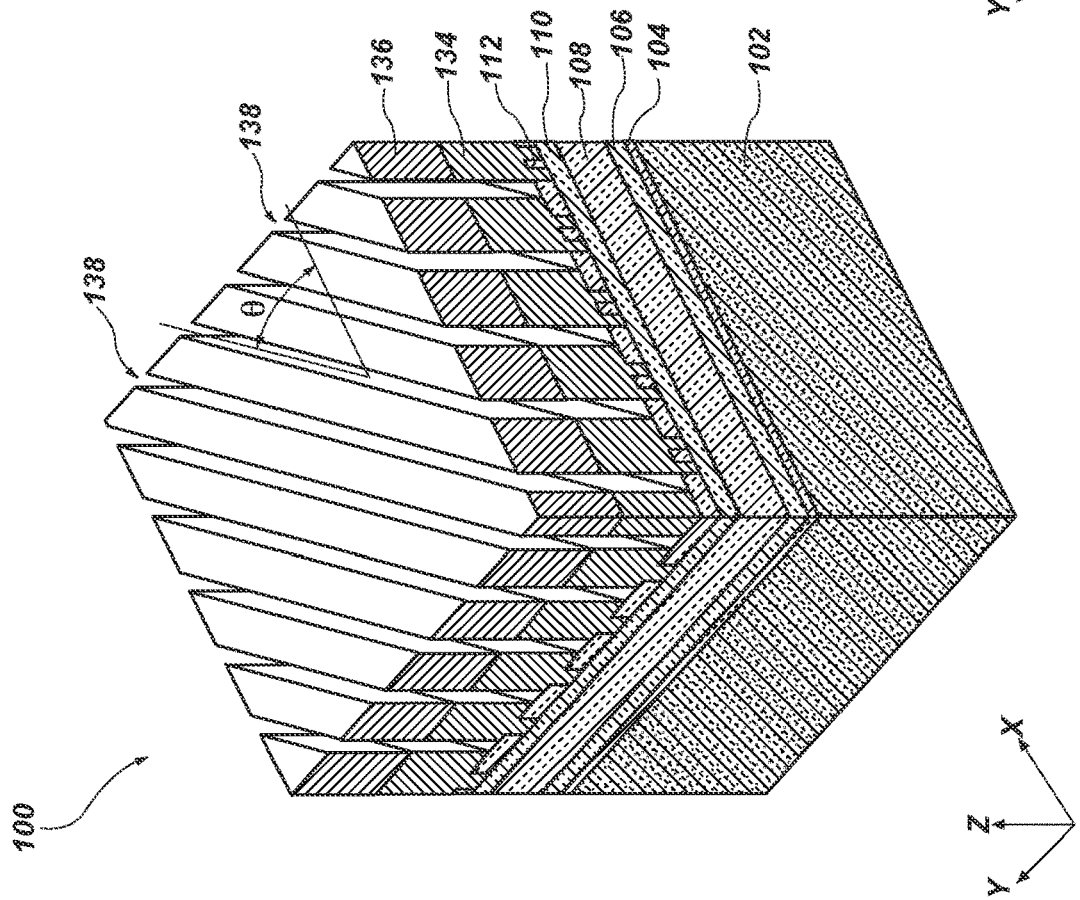

Referring now to FIG. 1K, after forming the first lines 125 (FIG. 1J) and the second lines 135 (FIG. 1J) in the third oxide material 112, an additional underlayer material 134 may be formed over the third oxide material 112 and a multilayer resist (MLR) material 136 (also referred to herein as a "tri-layer photo stack") may be formed over the additional underlayer material 134.

The multilayer resist material 136 may be formed of and include one or more of one or more photoresist materials, such as one or more of polymethyl methacrylate (PMMA), one or more of the materials described above with reference to the photoresist material 120, a deep ultraviolet (DUV) photoresist, a diazophthoquinone (DNQ) material, and additional photoresist materials. However, the disclosure is not so limited and the multilayer resist material 136 may include materials other than those described.

In some embodiments, the multilayer resist material 136 may be formed and patterned by, for example, extreme ultraviolet patterning. Trenches 138 may be formed in the multilayer resist material 136. In some embodiments, the trenches 138 may extend at an angle θ relative to an axis (e.g., the X-axis) of the microelectronic device 100. By way of non-limiting example, the angle θ may be greater than about zero (0) degrees and less than about ninety (90) degrees, such as within a range from about (20) degrees to about seventy (70) degrees, from about thirty (30) degrees to about sixty (60) degrees, or from about forty (40) degrees to about fifty (50) degrees. In some embodiments, the angle θ may be about forty-one (41) degrees. However, the disclosure is not so limited and the angle θ may be different than those described above.

In some embodiments, exposed portions of the additional underlayer material 134 may be removed through the trenches 138 to expose portions of the third oxide material 112. With reference to FIG. 1L, the multilayer resist material 136 (FIG. 1K) may be removed from the microelectronic device 100. In some embodiments, after removing the multilayer resist material 136, the exposed portions of the third oxide material 112 may be removed through the trenches 138. After removing the exposed portions of the third oxide material 112, the additional underlayer material 134 may be removed. In some embodiments, the additional underlayer material 134 is removed by ashing, as described above with reference to removal of the underlayer material 132 (FIG. 1G).

With continued reference to FIG. 1L, removal of the exposed portions of the third oxide material 112 may form isolated structures 140 of the second oxide material 108. In some embodiments, the isolated structures 140 exhibit an S-shape. As will be described herein, the shape and pattern of the isolated structures 140 may be transferred to the base material 102 to form memory cell structures.

Figure 1M:
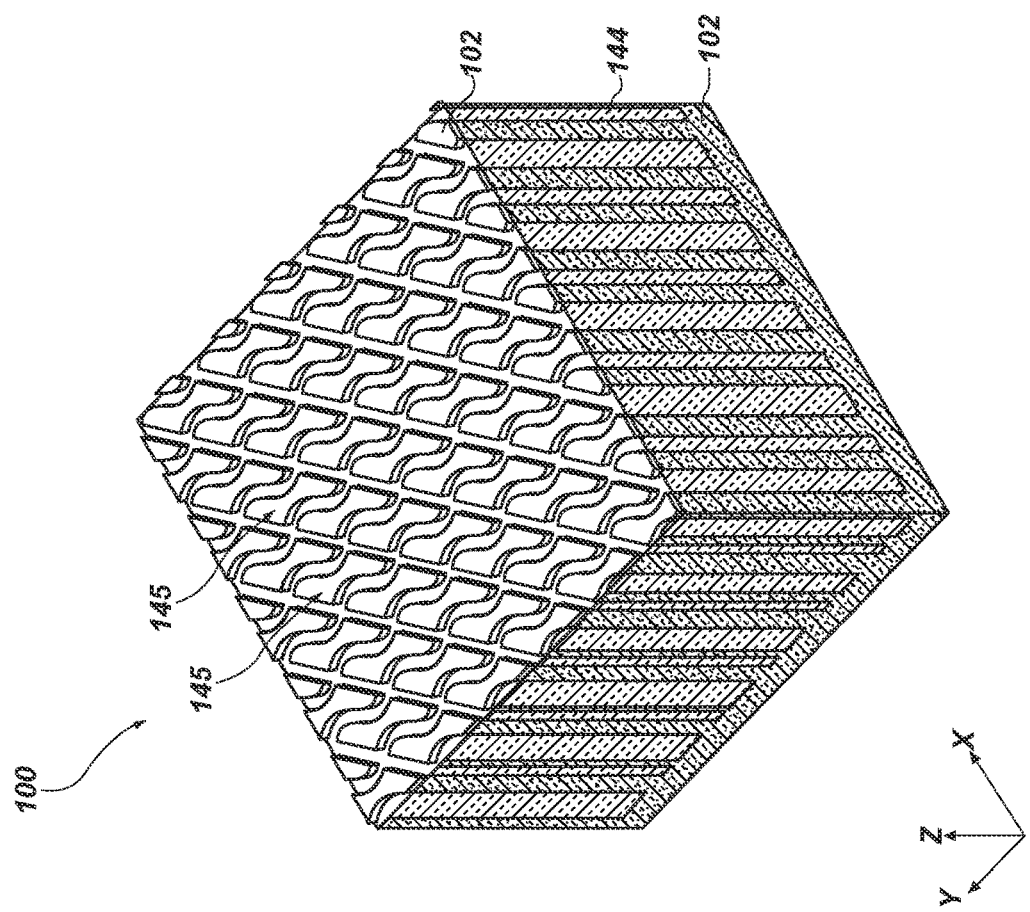

With reference to FIG. 1M, the pattern of the isolated structures 140 may be transferred from the third oxide material 112 (FIG. 1L) to the hard mask material 106. In some embodiments, exposed portions of the first sacrificial material 110 are removed through the third oxide material 112 and the third oxide material 112 is selectively removed. After removal of the third oxide material 112, exposed portions of the second oxide material 108 may be removed and the first sacrificial material 110 may be removed.

Exposed portions of the hard mask material 106 may be removed through the second oxide material 108 to transfer the isolated structures 140 to the hard mask material 106. After forming the isolated structures 140 in the hard mask material 106, the second oxide material 108 may be removed. In some embodiments, the first oxide material 104 is removed to expose surfaces of the base material 102.

Figure 1N:
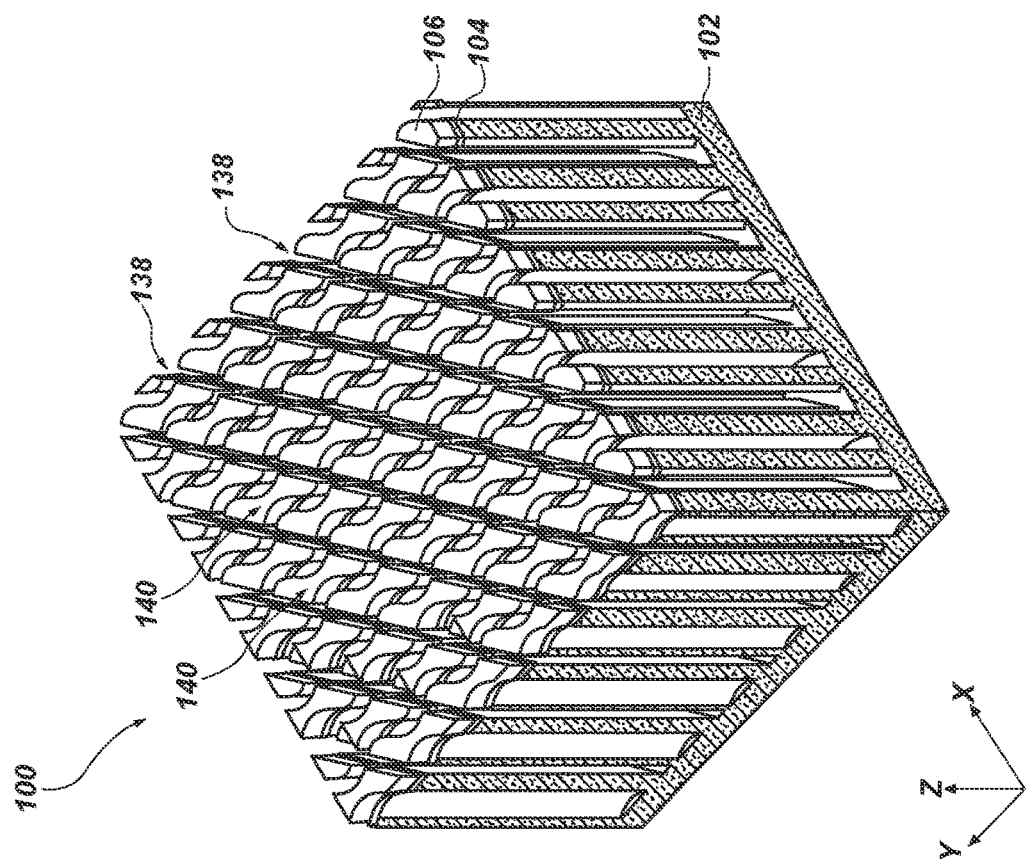
Figure 10:
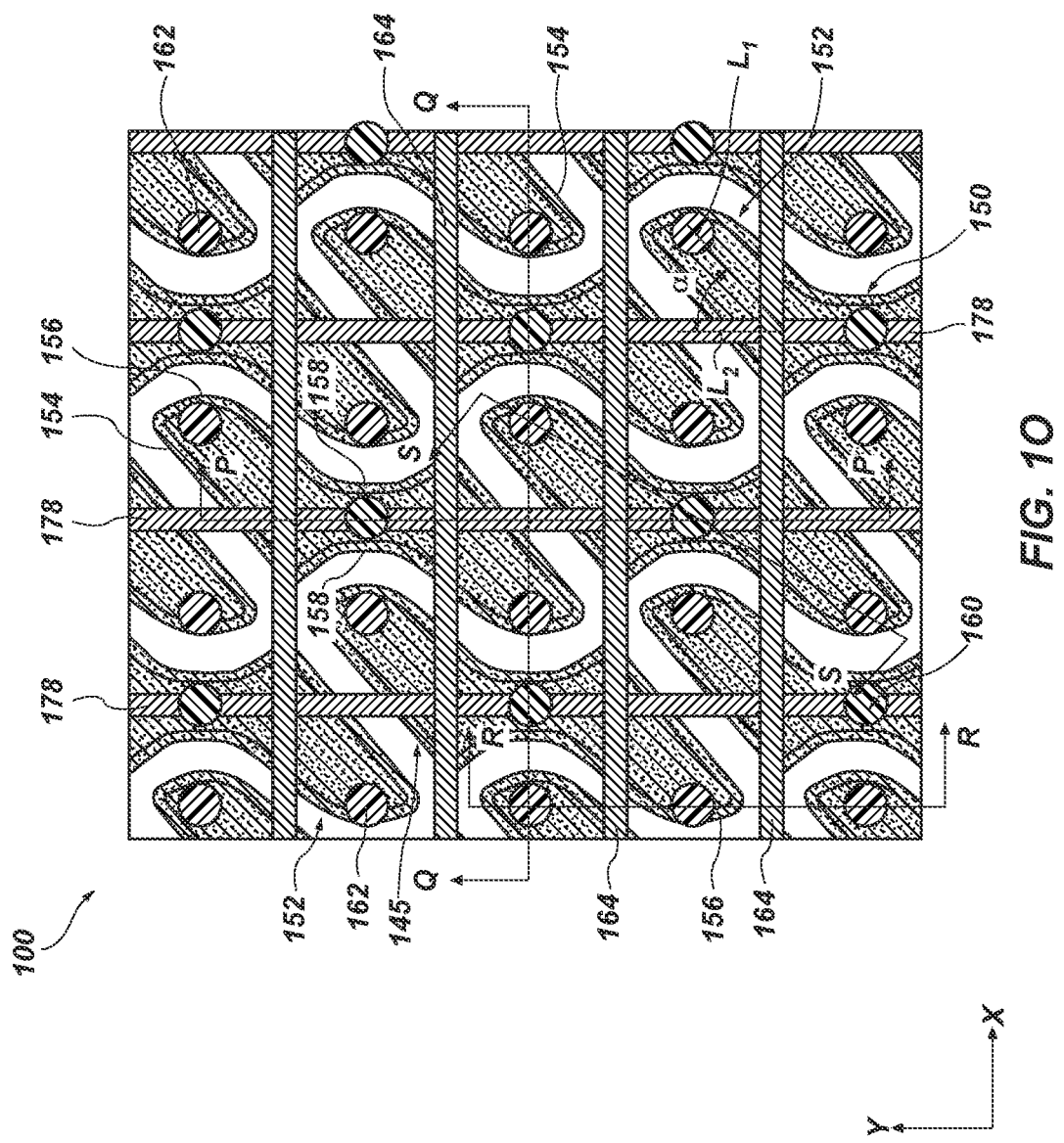

With reference to FIG. 1N, after forming the isolated structures 140 in the hard mask material 106 (FIG. 1M), exposed portions of the first oxide material 104 and portions of the base material 102 may be removed through the hard mask material 106 to form isolated memory cell structures 145 (also referred to herein as "isolated semiconductive pillar structures") within the base material 102. In some embodiments, the memory cell structures 145 may be isolated by isolation structures (also referred to herein as "shallow trench isolation structures") comprising an insulative material 144.

The insulative material 144 may be formed of and include insulative material, such as, for example, one or more of at least one dielectric oxide material (silicon dioxide, phosphosilicate glass, borosilicate glass, borophosphosilicate glass, fluorosilicate glass, an aluminum oxide ($AlO_x$), a hafnium oxide ($HfO_x$), a niobium oxide ($NbO_x$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), and at least one dielectric carboxynitride material (e.g., a silicon carboxynitride ($SiO_xC_zN_y$)). In some embodiments, the insulative material 144 comprises silicon dioxide.

Figure 1Q:
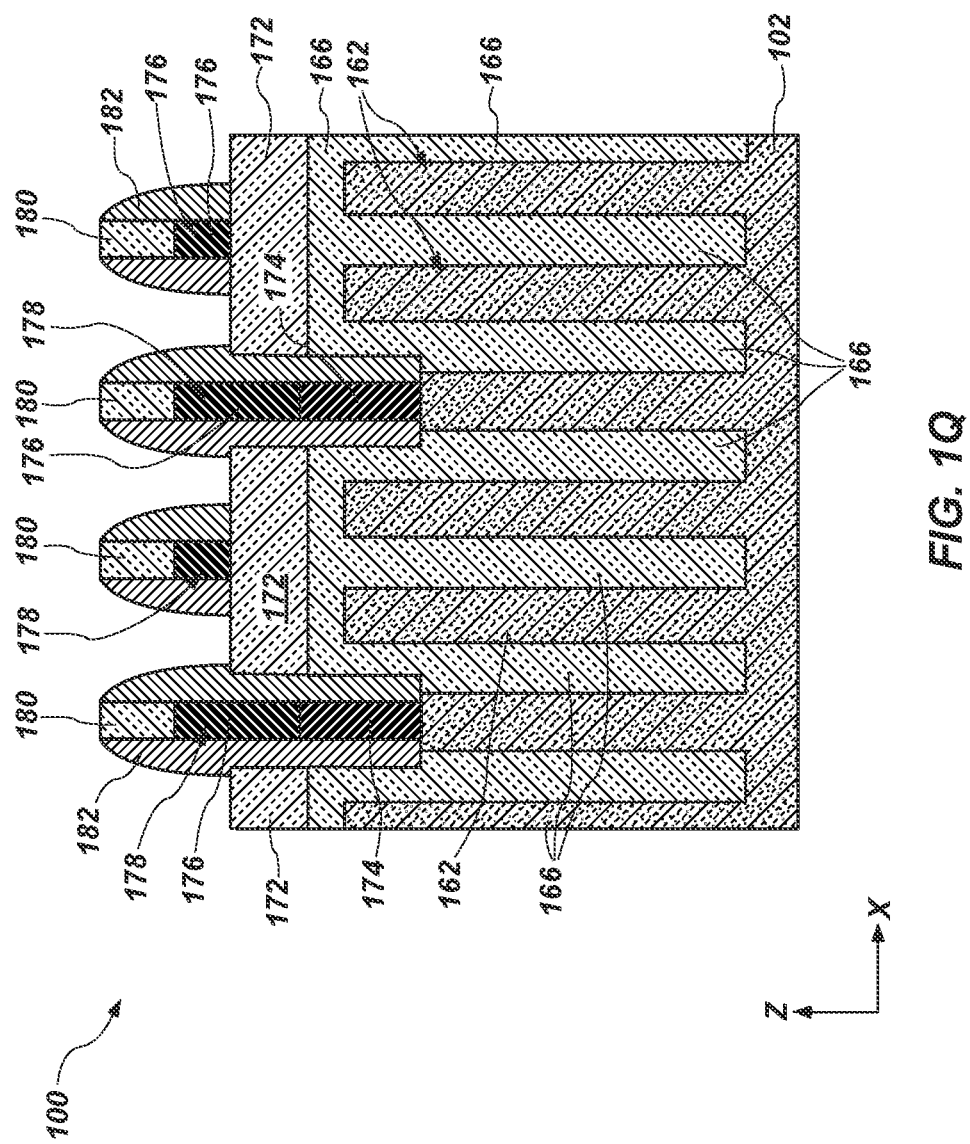

With reference to FIG. 1O through FIG. 1S, additional processing acts may be performed on the microelectronic device 100. FIG. 1O is a simplified partial top-down view of the microelectronic device 100. FIG. 1P is a simplified partial cross-sectional view of the microelectronic device 100 of FIG. 1O taken through section line P-P; FIG. 1Q is a simplified partial cross-sectional view of the microelectronic device 100 of FIG. 1O taken through section line R-R of FIG. 1O; FIG. 1R is a simplified partial cross-sectional view of the microelectronic device 100 of FIG. 1O taken through section line R-R; and FIG. 1S is a simplified partial cross-sectional view of the microelectronic device of FIG. 1O taken through section line S-S.

With reference to FIG. 1O and when viewed from the top-down perspective, each of the isolated memory cells structures 145 may exhibit an S-shape, each individually including a central portion 150 located between opposing end portions 152 (e.g., a first end portion laterally spaced (e.g., in the Y-direction) from a second end portion 152).

The end portions 152 may each individually be at least partially defined by a substantially linear surface 154. The linear surfaces 154 may be defined by the location of the trenches 138 (FIG. 1K). The end portions 152 may each individually further include arcuate (e.g., curved) surfaces 156 corresponding to the curved surfaces of the spacers 130 (FIG. 1C) defined by the surfaces of the second sacrificial material 114 (FIG. 1C) (and the corresponding surfaces of the lines 122 (FIG. 1A, FIG. 1B) of the photoresist material 120). In some embodiments, the substantially linear surface 154 of each end portion 152 may be opposite the arcuate surface 156 of the respective end portion 152. In some embodiments, the substantially linear surface 154 of a first end portion 152 may be located on an opposite lateral (e.g., in the Y-direction) end of the microelectronic device 100 relative to the substantially linear surface 154 of a second end portion 152. In some embodiments, the substantially linear surface 154 of a first end portion 152 of an isolated memory cell structure 145 is substantially laterally aligned (e.g., substantially parallel) with the substantially linear surface 154 of a second end portion 152 of the isolated memory cell structure 145 in a second lateral direction (e.g., in the X-direction). In some embodiments, the arcuate surface 156 of a first end portion 152 may be located on an opposite lateral (e.g., in the X-direction) end of the microelectronic device 100 relative to the arcuate surface 156 of a second end portion 152.

The central portions 150 may individually be defined by inwardly oriented arcuate (e.g., curved) surfaces 158 at least partially defined by the curved surfaces of the spacers 130 (FIG. 1C) and the second sacrificial material 114 (FIG. 1C) that are, in turn, defined by the widened rounded portions 126 (FIG. 1B) and the narrow curved portions 128 (FIG. 1B) of the lines 122 (FIG. 1A, FIG. 1B) of the photoresist material 120 (FIG. 1A, FIG. 1B). The inwardly oriented arcuate surfaces 158 of the central portions 150 may define a smallest width (e.g., in the X-direction) of the central portions 150 and may be located proximate a digit line (e.g., bit line) contact region 160. In some embodiments, the opposing arcuate surfaces 158 of the central portions 150 may be non-linear and may not be parallel.

With continued reference to FIG. 1O, each of the isolated memory cell structures 145 may individually include a digit line contact region 160 located on the central portion 150 of the isolated memory cell structure 145 and storage node (e.g., memory cell) contact regions 162 located on the end portions 152 of the respective isolated memory cell structure 145. As will be described herein, digit line contacts (e.g., digit line contacts 174 (FIG. 1P)) and storage node contacts (e.g., storage node contacts 184 (FIG. 1R)) may be formed on the respective ones of the digit line contact regions 160 and the storage node contact regions 162. Although the digit line contact regions 160 and the storage node contact regions 162 have been illustrated in FIG. 1O as having a particular lateral dimension, it will be understood that the lateral dimension of digit line contact regions 160 and the storage node contact regions 162 may be different than that illustrated in FIG. 1O. In some embodiments, the central portion 150 may exhibit a minimum lateral dimension (e.g., a width in the X-direction) at the digit line contact region 160.

The storage node contact regions 162 may be located adjacent (e.g., on, over) the end portions 152 of the isolated memory cell structures 145. The digit line contact regions 160 may be located adjacent (e.g., on, over) the central portions 150 of the isolated memory cell structures 145. In some embodiments, the digit line contact region 160 of a first isolated memory cell structure 145 laterally neighbors the end portions 152 of neighboring isolated memory cell structures 145. In some embodiments, the storage node contact region 162 of an upper end portion 152 of a first isolated memory cell structure 145 is laterally aligned with the storage node contact region 162 of a lower end portion 152 of neighboring isolated memory cell structures 145.

In some embodiments, the digit line contact region 160 of a first isolated memory cell structure 145 is laterally (e.g., in the X-direction) aligned with laterally (e.g., in the Y-direction) neighboring memory cell structures 145.

With continued reference to FIG. 1O, in some embodiments, the lateral (e.g., in the X-direction, in the Y-direction) spacing between laterally neighboring isolated memory cell structures 145 may be different based on, for example, the registration of the multilayer resist material 136 (FIG. 1K) and the trenches 138 (FIG. 1K) in the multilayer resist material 136. Although FIG. 1O illustrates that the end portions 152 of each isolated memory cell structure 145 exhibit substantially the same size, the disclosure is not so limited. In other embodiments, the upper (e.g., in the Y-direction) end portion 152 of each isolated memory cell structure 145 may have a larger or smaller dimension and corresponding cross-sectional area than the lower (e.g., in the Y-direction) end portion 152 of the respective isolated memory cell structure 145 based on the registration (e.g., alignment) of the trenches 138 within the multilayer resist material 136.

With reference to FIG. 1O and FIG. 1P, word lines 164 may be formed within isolation trenches between the storage node contact regions 162 and the digit line contact regions 160 by conventional techniques. In some embodiments, each of the isolated memory cell structures 145 may be intersected by two word lines 164. The end portions 152 of each isolated memory cell structure 145 may be intersected by the word lines 164.

An insulative material 166 (not illustrated in FIG. 1O for clarity and ease of understanding the description) may be formed over the microelectronic device 100 and may fill regions between adjacent isolated memory cell structures 145. The insulative material 166 may be formed of and include a dielectric material, such as one or more of the materials described above with reference to the insulative material 144 (FIG. 1N). In some embodiments, the insulative material 166 comprises silicon dioxide.

After forming the insulative material 166, portions of the insulative material 166 and portions of the isolated memory cell structures 145 between the central portions 150 and the end portions 152 may be removed. For example, a mask material may be formed over the microelectronic device 100 with openings (e.g., trenches) extending in a first lateral direction (e.g., the X-direction) and the portions of the insulative material 166 and portions of the isolated structures 140 may be removed through the openings in the mask material.

In some embodiments, after forming the openings, exposed portions of the base material 102 may be exposed to an ion implantation process to form channel regions 181 of transistor structures. A dielectric material 168 (e.g., a gate dielectric material) may be formed within the openings and a conductive material 170 may be formed over the dielectric material 168 to form the word lines 164. The dielectric material 168 may be formed of and include one or more phosphosilicate glass, borosilicate glass, borophosphosilicate glass (BPSG), fluorosilicate glass, silicon dioxide, titanium dioxide, zirconium dioxide, hafnium dioxide, tantalum oxide, magnesium oxide, aluminum oxide, niobium oxide, molybdenum oxide, strontium oxide, barium oxide, yttrium oxide, a nitride material, (e.g., silicon nitride ($Si_3N_4$)), an oxynitride (e.g., silicon oxynitride), another gate dielectric material, a dielectric carbon nitride material (e.g., silicon carbon nitride (SiCN)), a dielectric carboxynitride material (e.g., silicon carboxynitride (SiOCN)), or combinations thereof.

The conductive material 170 may be formed of and include one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the conductive material 170 comprises one or more of elemental molybdenum, elemental tungsten, and elemental cobalt with one or more of polysilicon, germanium, and silicon germanium.

In some embodiments, and with continued reference to FIG. 1O, the word lines 164 may separate the central portions 150 from the end portions 152. Stated another way, in some embodiments, the word lines 164 may intervene between the central portions 150 and the end portions 152 of the isolated memory cell structures 145. Accordingly, the word lines 164 may be located in isolation trenches (e.g., including the insulative material 166) separating the digit line contact regions 160 from the storage node contact regions 162 of each of the isolated memory cell structures 145. Accordingly, the isolated memory cell structures 145 as described herein may each comprise a central portion 150 spaced from end portions 152 (e.g., a first end portion 152 and a second end portion 152) by word lines 164 (e.g., a first word line 164 and a second word line 164). After forming the word lines 164, remaining portions of the openings may be filled with an insulative material 172, which may include one or more of the materials described above with reference to the insulative material 166. In some embodiments, the insulative material 172 comprises the same material composition as the insulative material 166.

With continued reference to FIG. 1O, a longitudinal axis $L_1$ of the end portions 152 of the isolated memory cell structures 145 may be oriented at an angle α with respect to a longitudinal axis $L_2$ of the central portion 150. The longitudinal axis $L_2$ of the central portion 150 may correspond to and be substantially parallel to a digit line 178 vertically overlying the central portion 150. The angle α may be greater than about zero (0) degrees and less than about ninety (90) degrees, such as within a range from about (20) degrees to about seventy (70) degrees, from about thirty (30) degrees to about sixty (60) degrees, or from about forty (40) degrees to about fifty (50) degrees. In some embodiments, the angle α may be about forty-nine (49) degrees. In some embodiments, the sum of the angle α and the angle θ (FIG. 1K) may be about ninety (90) degrees.

With reference to FIG. 1P and FIG. 1Q, after forming the word lines 164, openings may be formed through portions of the insulative material 172 and the insulative material 166 to expose surfaces of the digit line contact regions 160 of the isolated memory cell structures 145. The openings may be formed by, for example, forming and patterning a mask over the microelectronic device 100 and exposing the microelectronic device 100 to suitable etchants. Digit line contacts 174 may be formed within the openings and on the digit line contact regions 160.

The digit line contacts 174 may be formed of and include at least one electrically conductive material. In some embodiments, the digit line contacts 174 comprise one or more of titanium nitride, tantalum nitride, titanium aluminum nitride, elemental titanium, elemental platinum, elemental rhodium, elemental iridium, iridium oxide, elemental ruthenium, ruthenium oxide, elemental molybdenum, elemental tungsten, elemental cobalt, polysilicon, germanium, and silicon germanium. In some embodiments, the digit line contacts 174 comprise one or more of elemental molybdenum, elemental tungsten, and elemental cobalt with one or more of polysilicon, germanium, and silicon germanium. In some embodiments, the digit line contacts 174 comprise doped polysilicon. By way of non-limiting example, the digit line contacts 174 may include at least about $10^{20}$ atom/cm$^3$, or even at least about $10^{21}$ atom/cm$^3$.

In some embodiments, the digit line contacts 174 are recessed relative to upper surfaces of the insulative material 172. After forming the digit line contacts 174, a conductive material 176 may be formed over the microelectronic device structure 100 and in contact with the digit line contacts 174 to form digit lines 178. The conductive material 176 of the digit lines 178 may be formed of and include one or more of the materials described above with reference to the word lines 164.

After forming the digit line contacts 174 and the digit lines 178, an insulative material 180 may be formed over the digit lines 178. In some embodiments, spacers 182 (e.g., "bit line spacers," "digit line spacers") may be formed on sides of the digit lines 178. The insulative material 180 and the spacers 182 may individually be formed of and include one or more of the materials described above with reference to the insulative material 166 and the insulative material 172.

With reference to FIG. 1R storage node contacts 184 may be formed over the storage node contact regions 162 of the isolated structures 140. The storage node contacts 184 may be formed of and include one or more of the materials described above with reference to the digit line contacts 174.

The storage node contacts 184 may be in electrical communication with the storage node contact regions 162 of the isolated structures 140. The storage node contacts 184 may be located between adjacent portions of the insulative materials 172 and the insulative material 180. The storage node contacts 184 may be formed of and include one or more of the materials described above with reference to the digit line contacts 174. In some embodiments, the storage node contacts 184 comprise doped polysilicon. By way of non-limiting example, the storage node contacts 184 may include at least about $10^{20}$ atom/cm$^3$, or even at least about $10^{21}$ atom/cm$^3$. In some embodiments, the microelectronic device 100 is exposed to annealing conditions to diffuse dopants from the digit line contacts 174 and the storage node contacts 184 to form, for example, source regions, drain regions, and the channel regions 181 of transistor structures.

With continued reference to FIG. 1O through FIG. 1R, in some embodiments, the digit line contacts 174 may be aligned in the Y-direction and may be offset from the storage node contacts 184 in the X-direction. In some embodiments, the digit line contacts 174 may not be aligned with any of the storage node contacts 184 in a direction in which the digit lines 178 extend. In addition, the storage node contacts 184 may be aligned with each other in the Y-direction.

The microelectronic device 100 may include memory cells, each including an access transistor (e.g., a transistor comprising a gate along one of the word lines 164) coupled with a storage node structure 186 (e.g., capacitor structure). Only one storage node structure 186 is illustrated in FIG. 1R, but it will be understood that all of the storage node contacts 184 may be coupled to a storage node structure 186.

With continued reference to FIG. 1R, the storage node structures 186 may be formed over and in electrical communication with the storage node contacts 184. The storage node structures 186 are not illustrated in FIG. 1O for clarity and ease of understanding of the disclosure.

In some embodiments, a redistribution material (RDM) structure 188 (also referred to as "redistribution layer (RDL) structures") may be formed on or over the storage node contacts 184, and the storage node structures 186 and may be in electrical communication with the storage node structures 186 and the storage node contacts 184.

The RDM structures 188 may be configured to effectively shift (e.g., stagger, adjust, modify) lateral positions (e.g., in the X-direction, in the Y-direction) of the storage node contacts 184 to accommodate a desired arrangement (e.g., a hexagonal close packed arrangement) of the storage node structures 186 over and in electrical communication with the storage node contacts 184. The RDM structures 188 may each individually be formed of and include an electrically conductive material including, but not limited to, one or more of a metal (e.g., tungsten, titanium, nickel, platinum, gold), a metal alloy, a metal-containing material (e.g., metal nitrides, metal silicides, metal carbides, metal oxides), and a conductively-doped semiconductor material (e.g., conductively-doped silicon, conductively-doped germanium, conductively-doped silicon germanium). By way of non-limiting example, the RDM structures 188 may individually comprise one or more of W, TiN, TaN, WN, TiAlN, Ti, Pt, Rh, Ir, $IrO_x$, Ru, $RuO_x$, and alloys thereof.

The storage node structures 186 may be configured to store a charge representative of a programmable logic state. For example, a charged state of the storage node structures 186 may represent a first logic state (e.g., a logic 1), and an uncharged state of the storage node structures 186 may represent a second logic state (e.g., a logic 0). In some embodiments, the storage node structures 186 comprise a dielectric material configured to store a charge associated with a logic state. The dielectric material may, for example, comprise one or more of include silicon dioxide, silicon nitride, polyimide, titanium dioxide ($TiO_2$), tantalum oxide ($Ta_2O_5$), aluminum oxide ($Al_2O_3$), an oxide-nitride-oxide material (e.g., silicon dioxide-silicon nitride-silicon dioxide), strontium titanate ($SrTiO_3$) (STO), barium titanate ($BaTiO_3$), hafnium oxide ($HfO_2$), zirconium oxide ($ZrO_2$), a ferroelectric material (e.g., ferroelectric hafnium oxide, ferroelectric zirconium oxide, lead zirconate titanate (PZT), etc.), and a high-k dielectric material. In some embodiments, the storage node structures 186 comprise zirconium oxide.

The RDM structures 188 and the storage node structures 186 may each individually be formed using conventional processes (e.g., conventional deposition processes, such as one or more of in situ growth, spin-on coating, blanket coating, CVD, ALD, and PVD; conventional patterning and material removal processes, such as conventional alignment processes, conventional photolithographic exposure processes, conventional development processes, conventional etching processes) and conventional processing equipment, which are not described in detail herein.

FIG. 1S is a simplified partial cross-sectional view of the microelectronic device 100 through a single one of the isolated memory cell structures 145. With reference to FIG. 1S, each memory cell structure 145 may include a first semiconductive pillar 190 at a first end portion 152 of the memory cell structure 145, a second semiconductive pillar 192 at a central portion 150 of the memory cell structure 145, and a third semiconductive pillar 194 at a second end portion 152 of the memory cell structure 145. The second semiconductive pillar 192 may be between the first semiconductive pillar 190 and the third semiconductive pillar 194. A first word line 164 is located between the first semiconductive pillar 190 and the second semiconductive pillar 192, and a second word line 164 is located between the second semiconductive pillar 192 and the third semiconductive pillar 194. The insulative material 166 may isolate the isolated memory cell structure 145 from laterally neighboring isolated memory cell structures 145.

Since the memory cell structures 145 each include two storage node structures 186, in some embodiments, the memory cell structures 145 may be referred to as dual bit memory cells.

Forming the isolated memory cell structures 145 to include the central portion 150 and the end portions 152 extending at the angle α with respect to the longitudinal axis $L_2$ of the central portion 150 may facilitate an increased active area for the digit line contacts 174 on the central portion 150 compared to conventional microelectronic devices. In addition, the size and shape of the isolated memory cell structures 145 may facilitate an increased landing area (e.g., from about 4 nm to about 5 nm more) for the storage node contacts 184 compared to conventional microelectronic device structures. In addition, forming the isolated memory cell structures 145 by the methods described herein may facilitate formation of the isolated memory cell structures 145 having a desired size, shape, and spacing and without complicated process flows, such as pitch quadrupling processes.

Although FIG. 1A through FIG. 1S have been described and illustrated as forming the microelectronic device 100 including forming the spacers 130 (FIG. 1C) and transferring the pattern of the spacers 130 to the third oxide material 112 (FIG. 1E) to form the first lines 125 (FIG. 1J) and the second lines 135 (FIG. 1J), the disclosure is not so limited. In other embodiments, the first lines 125 and the second lines 135 may be formed by other methods. By way of non-limiting example, in some embodiments, the spacers 130 are formed on the second sacrificial material 114, as described above with reference to FIG. 1C. After forming the spacers 130, the pattern of the second lines 135 (FIG. 1J) may be formed (e.g., printed) on the third oxide material 112 through spaces between laterally neighboring spacers 130. In some such embodiments, the spacers 130 may facilitate alignment of the second lines 135 with the first lines 125 (FIG. 1J). In other words, the spacers 130 may compensate for potential misregistration errors during printing of the second lines 135. After formation of the second lines 135, the spacers 130 may be removed and the pattern of the first lines 125 and the second lines 135 may be transferred to the third oxide material 112, followed by removal of the first sacrificial material 110. Formation of the microelectronic device 100 may be completed as described above with reference to FIG. 1K through FIG. 1S.

Figure 2B:
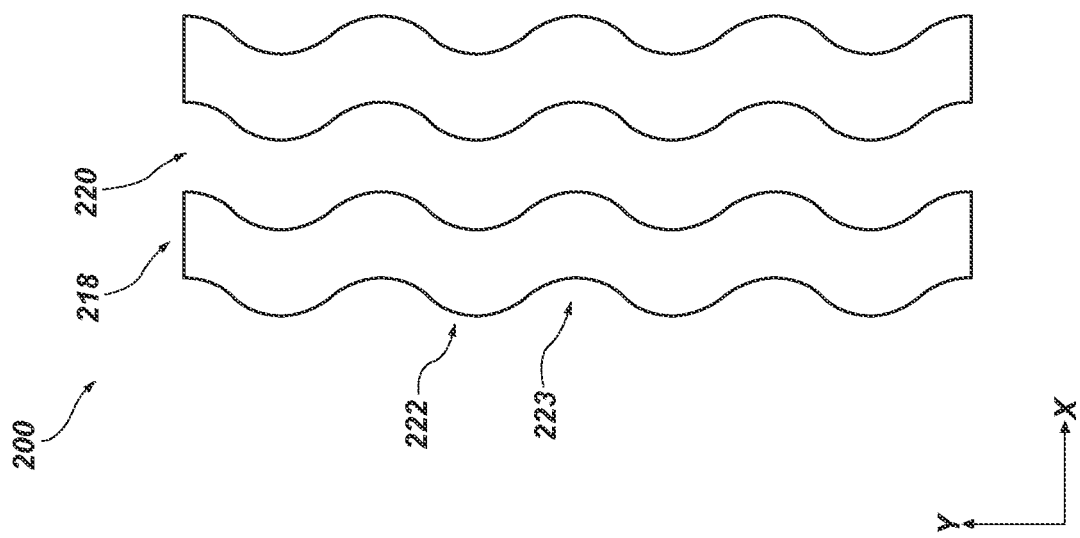
Figure 2A:
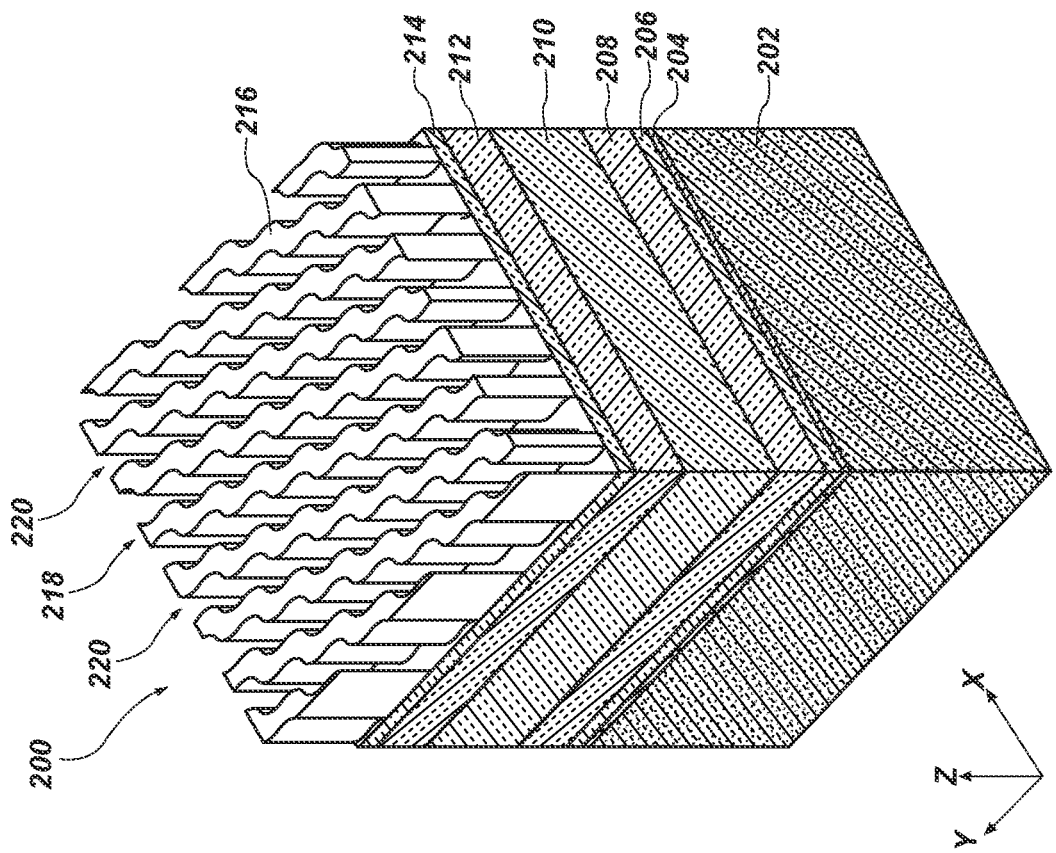

FIG. 2A through FIG. 2J illustrate a method of forming a microelectronic device, in accordance with embodiments of the disclosure. FIG. 2A is a simplified partial perspective view of a microelectronic device 200. The microelectronic device 200 may include a base material 202, a first oxide material 204 vertically (e.g., in the Z-direction) overlying the base material 202, a hard mask material 206 vertically overlying the first oxide material 204, a second oxide material 208 vertically overlying the hard mask material 206, a sacrificial material 210 vertically overlying the second oxide material 208, a carbon-containing material 212 vertically overlying the sacrificial material 210, a DARC material 214 vertically overlying the carbon-containing material 212, and a photoresist material 216 vertically overlying the DARC material 214. Each of the base material 202, the first oxide material 204, the hard mask material 206, the second oxide material 208, the sacrificial material 210, the carbon-containing material 212, the DARC material 214, and the photoresist material 216 may be substantially the same as the respective base material 102, first oxide material 104, hard mask material 106, the second oxide material 108, the first sacrificial material 110, the carbon-containing material 116, the DARC material 118, and the photoresist material 120 described above with reference to FIG. 1A.

FIG. 2B is a simplified partial top-down view illustrating two of the lines 218 of the photoresist material 216 of the microelectronic device 200 of FIG. 2A. With collective reference to FIG. 2A and FIG. 2B, the lines 218 of the photoresist material 216 may be spaced from each other by trenches 220. The lines 218 may exhibit a so-called weave pattern, each lines 218 exhibiting peaks 222 separated from each other by valleys 223. In some embodiments, the lines 218 exhibit a sinusoidal shape.

Referring now to FIG. 2C and FIG. 2D, the photoresist material 216 (FIG. 2A) may be exposed to one or more etch (e.g., trimming) chemistries to reduce a width of lines 218 of the photoresist material 216. After reducing the width of the lines 218 (FIG. 2A, FIG. 2B), exposed portions of the DARC material 214 and the carbon-containing material 212 may be removed through trimmed lines 218 of the photoresist material 216. After removing the exposed portions of the DARC material 214 and the carbon-containing material 212, the photoresist material 216 may be removed, such as by stripping.

With continued reference to FIG. 2C, exposed portions of the sacrificial material 210 may be removed through the DARC material 214 and the carbon-containing material 212. After removing the exposed portions of the sacrificial material 210, the DARC material 214 and the carbon-containing material 212 may be removed.

Spacers 224 may be formed on sides of the sacrificial material 210 to form second lines 226. After forming the spacers 224, the sacrificial material 210 may be removed to form the second lines 226 spaced by gaps 228. The gaps 228 may be defined by the dimensions (e.g., in the X-direction, in the Y-direction) of the sacrificial material 210 (FIG. 2C). The spacers 224 may be formed of and include one or more materials described above with reference to the spacers 130 (FIG. 1C). By way of non-limiting example, the spacers 224 may comprise a carbon-containing material (e.g., silicon carbon nitride (SiCN)), an oxynitride material (e.g., silicon oxynitride, silicon carboxynitride (SiOCN)), or another material.

The spacers 224 may exhibit a pitch $P_2$ within a range from about 15 nanometers (nm) to about 30 nm, such as from about 15 nm to about 20 nm, from about 20 nm to about 25 nm, or from about 25 nm to about 30 nm.

The second lines 226 may each individually exhibit a substantially sinusoidal shape (e.g., a shape substantially corresponding to a sinusoidal wave). In some embodiments, each of the second lines 226 of the spacers 224 exhibits an amplitude A within a range from about 2 nm to about 10 nm, such as from about 2 nm to about 4 nm, from about 4 nm to about 6 nm, or from about 6 nm to about 10 nm. In some embodiments, the amplitude is about 5 nm. The second lines 226 may each individually exhibit a period λ within a range from about 30 nm to about 40 nm, such as from about 30 nm to about 35 nm, or from about 35 nm to about 40 nm.

Figure 2E:
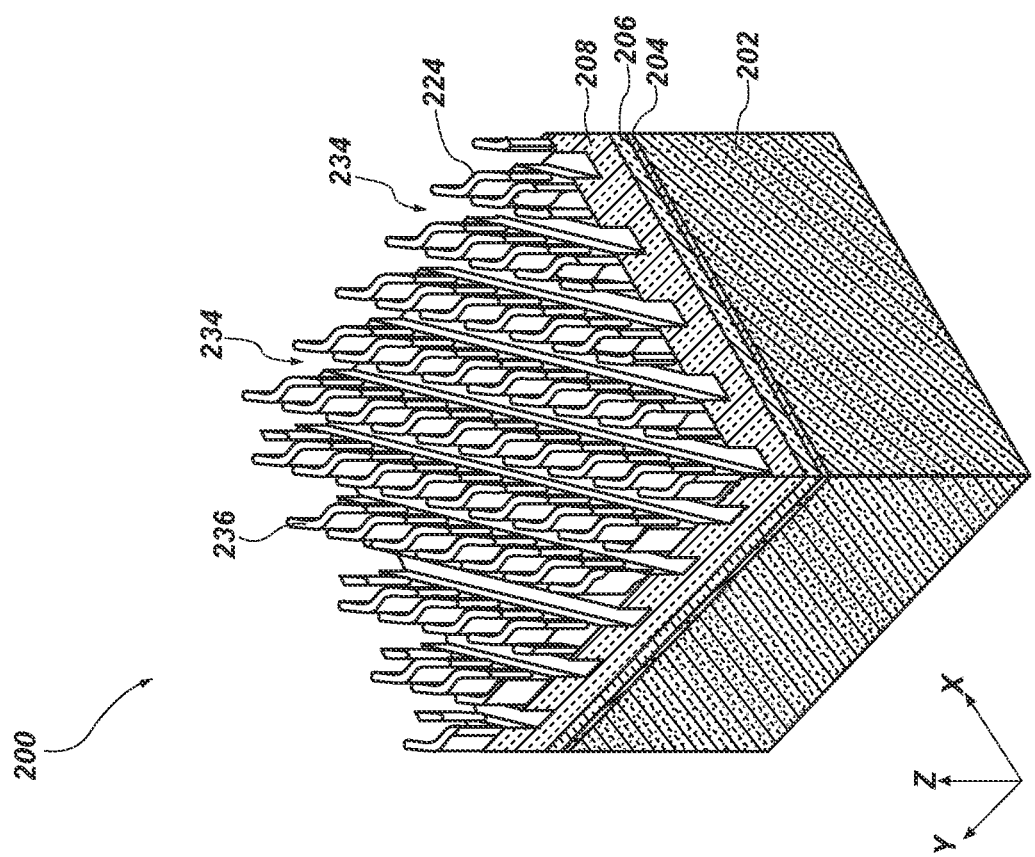

Referring to FIG. 2E, after forming the spacers 224, the sacrificial material 210 (FIG. 2C) may be selectively removed from the microelectronic device 200, as described above with reference to FIG. 1E and selective removal of the second sacrificial material 114. After removal of the sacrificial material 210 (FIG. 2C), an underlayer material 230 may be formed over the spacers 224 and within the gaps 228 (FIG. 2D) between the spacers 224 and a multilayer resist material 232 may be formed over the underlayer material 230. The underlayer material 230 may be formed of and include one or more of the materials described above with reference to the additional underlayer material 134 (FIG. 1K) and the multilayer resist material 232 may be formed of and include one or more of the materials described above with reference to the multilayer resist material 136 (FIG. 1K).

In some embodiments, the multilayer resist material 232 may be formed and patterned by, for example, extreme ultraviolet patterning. Trenches 234 may be formed in the multilayer resist material 232. In some embodiments, the trenches 234 may extend at an angle θ relative to an axis (e.g., the X-axis) of the microelectronic device 200, as described above with reference to the trenches 238 (FIG. 1K). In some embodiments, the angle θ is within a range from about (20) degrees to about seventy (70) degrees, such as about forty-one (41) degrees.

Figure 2F:
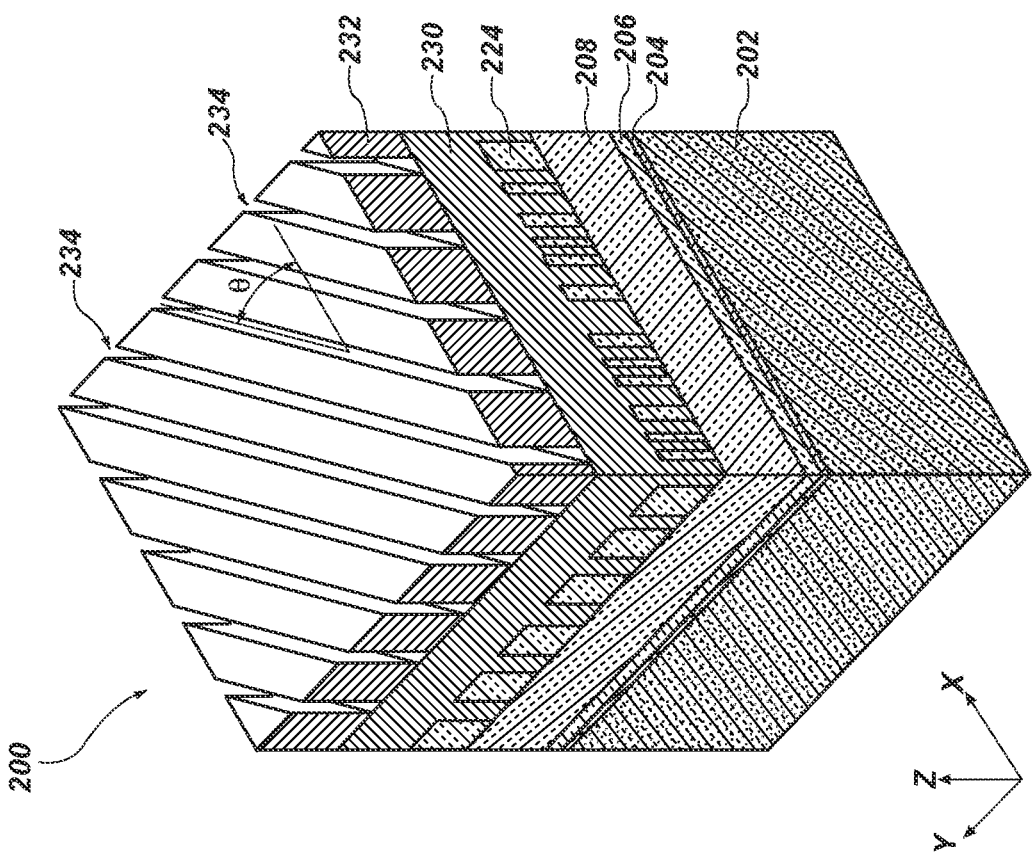

In some embodiments, exposed portions of the underlayer material 230 may be removed through the trenches 234 to expose portions of the second oxide material 208. With reference to FIG. 2F, the exposed portions of the second oxide material 208 and the spacers 224 may be removed through the trenches 234. Removal of the second oxide material 208 may form a pattern of isolated structures 236 of the spacers 224. In some embodiments, the multilayer resist material 232 may be removed prior to removing the exposed portions of the second oxide material 208. After removing the exposed portions of the second oxide material 208, the underlayer material 230 may be removed. In some embodiments, the underlayer material 230 is with a plasma, as described above with reference to removal of the underlayer material 132 (FIG. 1G).

Figures 2G, 2H:
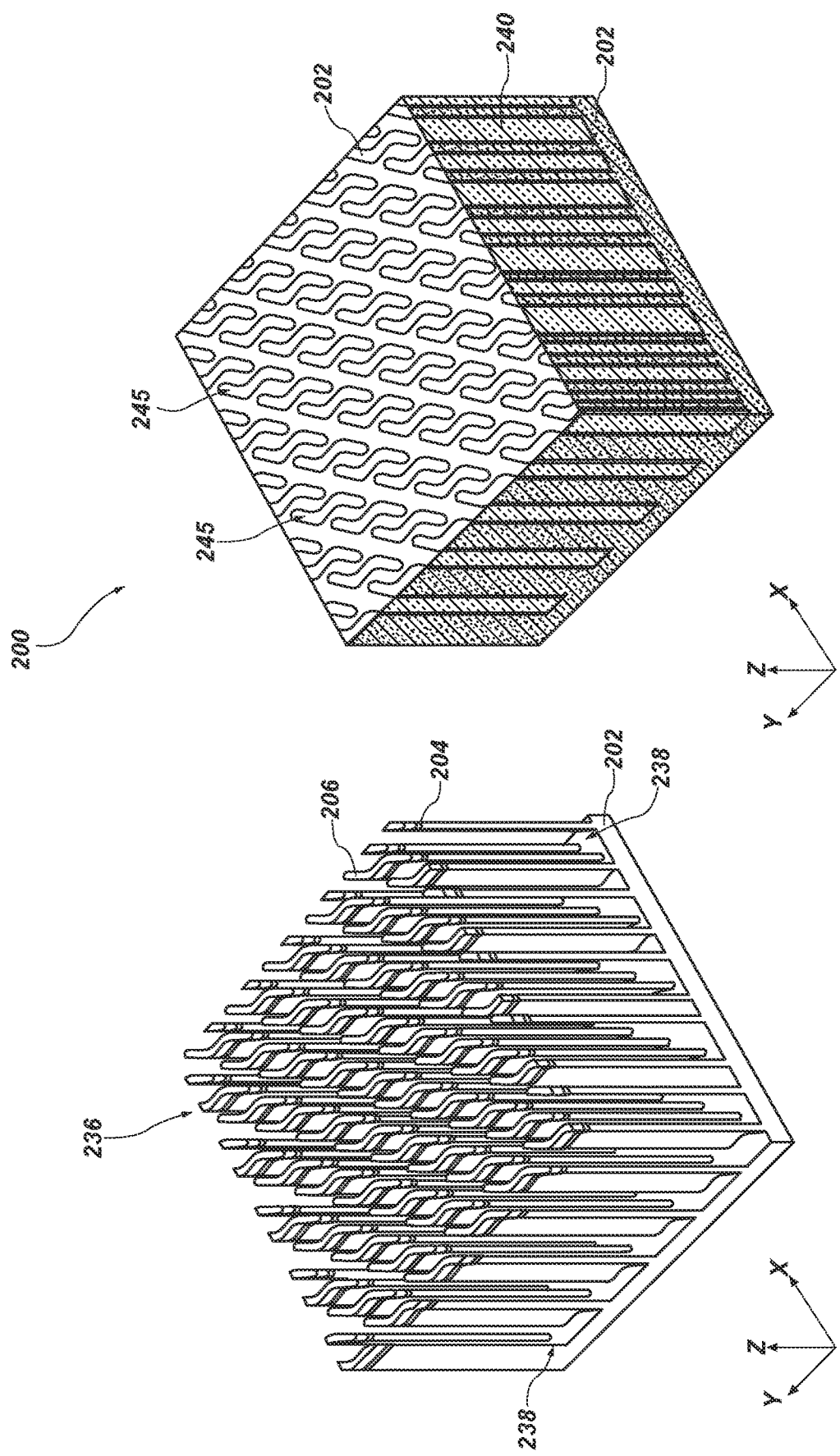

With reference to FIG. 2G, exposed portions of the second oxide material 208 (FIG. 2F) may be removed through the spacers 224 (FIG. 2F) and the spacers 224 may be removed. In some embodiments, exposed portions of the hard mask material 206 may be removed through the second oxide material 208 and the second oxide material 208 may be removed. Removal of the exposed portions of the hard mask material 206 may transfer the pattern of the isolated structures 236 to the hard mask material 206. Each of the first oxide material 204 and the base material 202 may be patterned through the hard mask material 206 to form trenches 238 in the base material 202. The location of the trenches 238 may correspond to the location of the gaps 228 (FIG. 2D) and the trenches 234 (FIG. 2F).

With reference to FIG. 2H, an insulative material 240 may be formed over the microelectronic device 200 and within the trenches 238 (FIG. 2G) within the base material 202. The insulative material 240 may be formed of and include one or more of the materials described above with reference to the insulative material 144 (FIG. 1N). In some embodiments, the insulative material 240 comprises silicon dioxide.

After forming the insulative material 240 within the trenches 238 (FIG. 2G) of the base material 202, the hard mask material 206 and the first oxide material 204 may be selectively removed, leaving a pattern of isolated memory cell structures 245 comprising the base material 202.

Figure 2J:
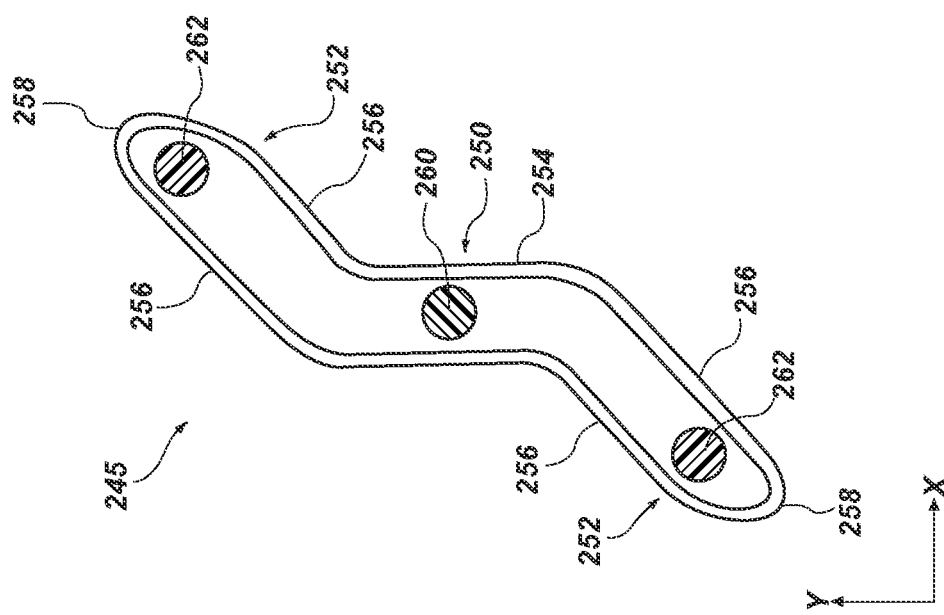
Figure 2I:
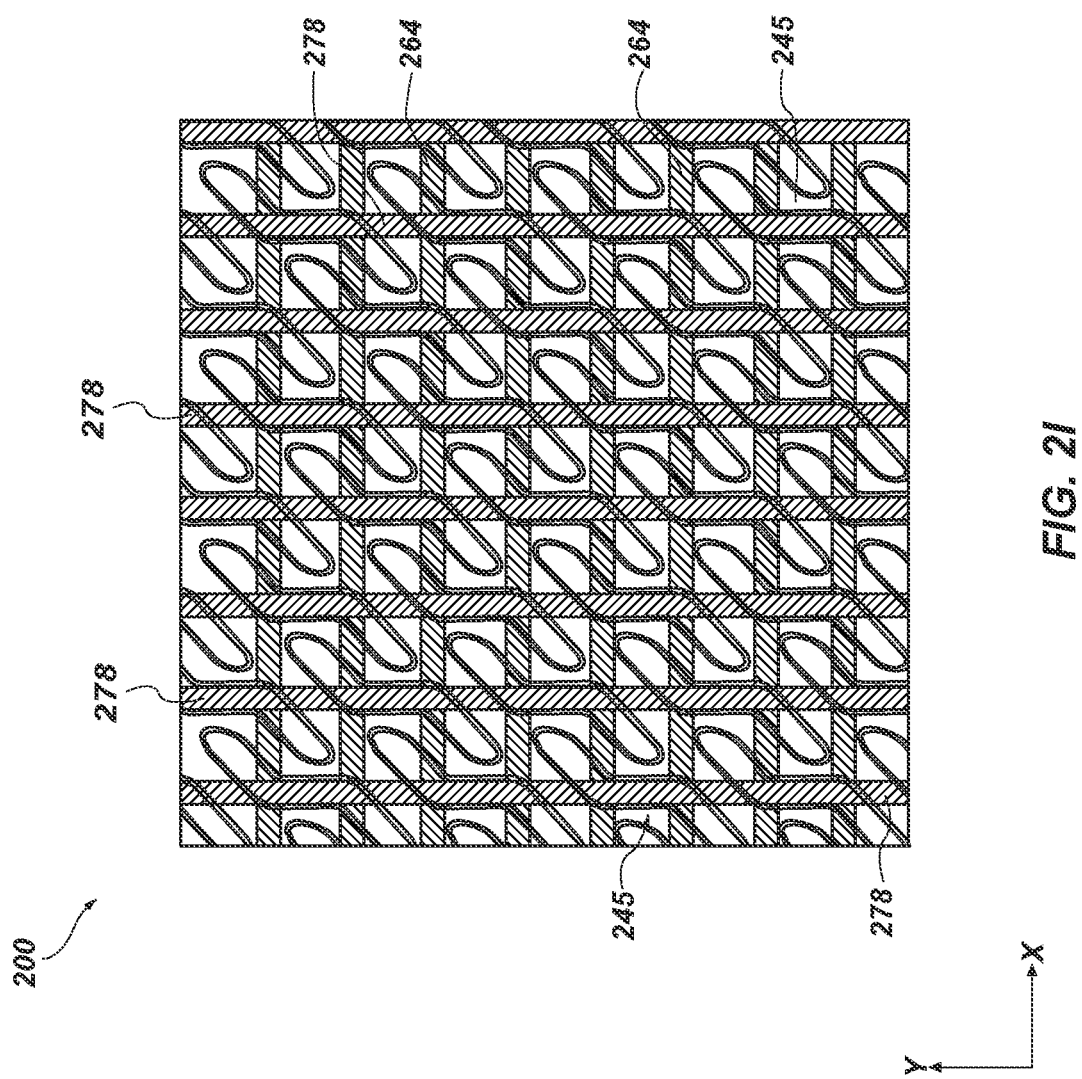

Additional processing acts may be performed to complete the microelectronic device 200, as described above with reference to FIG. 1O through FIG. 1S. FIG. 2I is a simplified top-down view of the microelectronic device of FIG. 2H and FIG. 2J is a simplified top-down view of one of the isolated memory cell structures 245 after further processing acts have been performed. By way of non-limiting example, word lines 264 and digit lines 278 may be formed within the microelectronic device 200, as described above with reference to FIG. 1O through FIG. 1S for the formation of the word lines 164 and the digit lines 178.

With reference to FIG. 2J, the isolated memory cell structures 245 may exhibit an S-shape each individually including a central portion 250 located laterally (e.g., in the X-direction, in the Y-direction) between end portions 252. The central portion 250 may be defined by substantially parallel and linear walls 254 extending substantially parallel with, for example, the digit lines 278. In some embodiments, a longitudinal axis of the central portions 250 are substantially aligned and parallel with the digit lines 278. The end portions 252 may include substantially parallel and linear walls 256 defined by, for example, the trenches 234 (FIG. 2E) formed in the multilayer resist material 232 (FIG. 2E). In some embodiments, laterally terminal portions of the end portions 252 may exhibit an arcuate surface 258 that may be defined by, for example, the shape of the lines 218 (FIG. 2A, FIG. 2B) of the photoresist material 216 (FIG. 2A, FIG. 2B) that, in turn, defines the shape of the lines 226 (FIG. 2C, FIG. 2D) of the spacers 224 (FIG. 2C, FIG. 2D).

With continued reference to FIG. 2J, the isolated memory cell structures 245 may each include a digit line contact region 260 at the central portion 250 and a storage node contact region 262 at each end portion 252, as described above with reference to the isolated memory cell structures 145 of FIG. 1O through FIG. 1S.

Figures 3A, 3B:
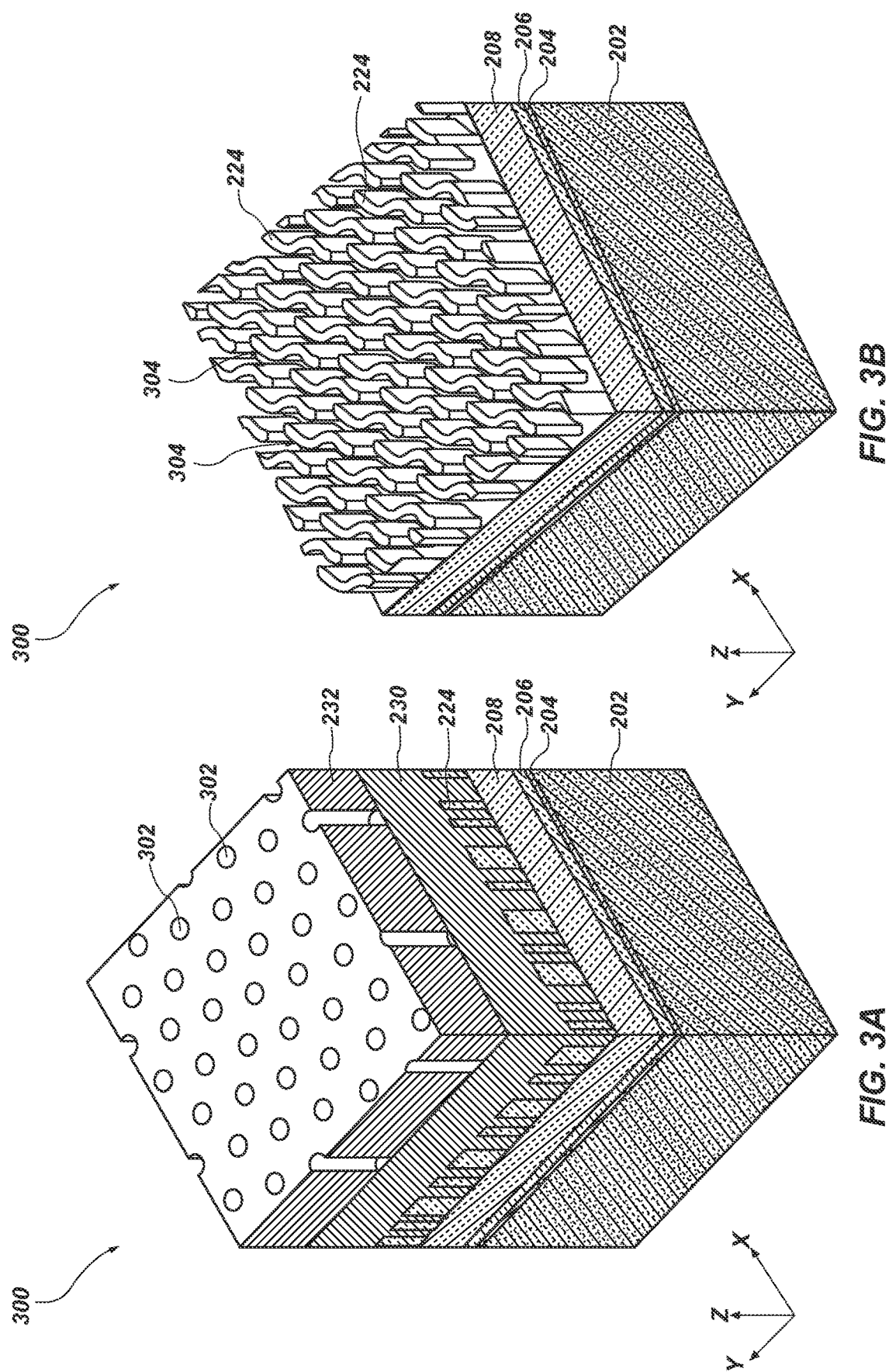
FIG. 3A through FIG. 3E are simplified partial perspective views (FIG. 3A through FIG. 3D) and a simplified partial top-down view (FIG. 3E) illustrating a method of forming a microelectronic device structure, in accordance with additional embodiments of the disclosure.

Although FIG. 2A through FIG. 2J have been described and illustrated as forming the microelectronic device 200 to include isolated memory cell structures 245 having a particular shape, the disclosure is not so limited. FIG. 3A is a simplified partial perspective view of a microelectronic device 300, in accordance with embodiments of the disclosure. The microelectronic device 300 may be substantially the same as the microelectronic device 200 of FIG. 2E, except that the multilayer resist material 232 may not include trenches 234 (FIG. 2E), but may include a pattern of holes 302.

With reference to FIG. 3B, portions of the underlayer material 230 (FIG. 3A) exposed through the holes 302 may be removed to form holes in the underlayer material 230. After removing the exposed portions of the underlayer material 230, the multilayer resist material 232 may be removed. The holes in the underlayer material 230 may expose portions of the spacers 224, which may be removed through the holes in the underlayer material 230 to form a pattern of isolated structures 304 of the spacers 224. Neighboring isolated structures 304 may be separated from one another by spaces corresponding to the size and spacing of the holes 302 (FIG. 3A).

Figure 3D:
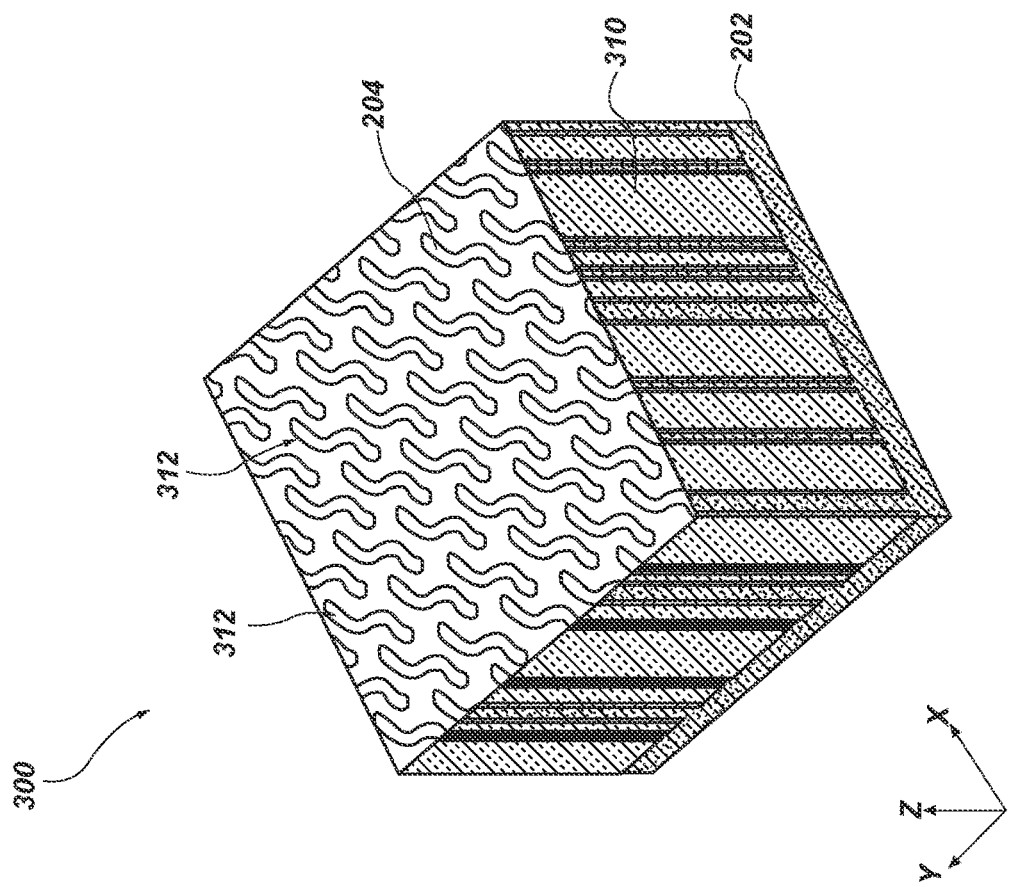
Figure 3C:
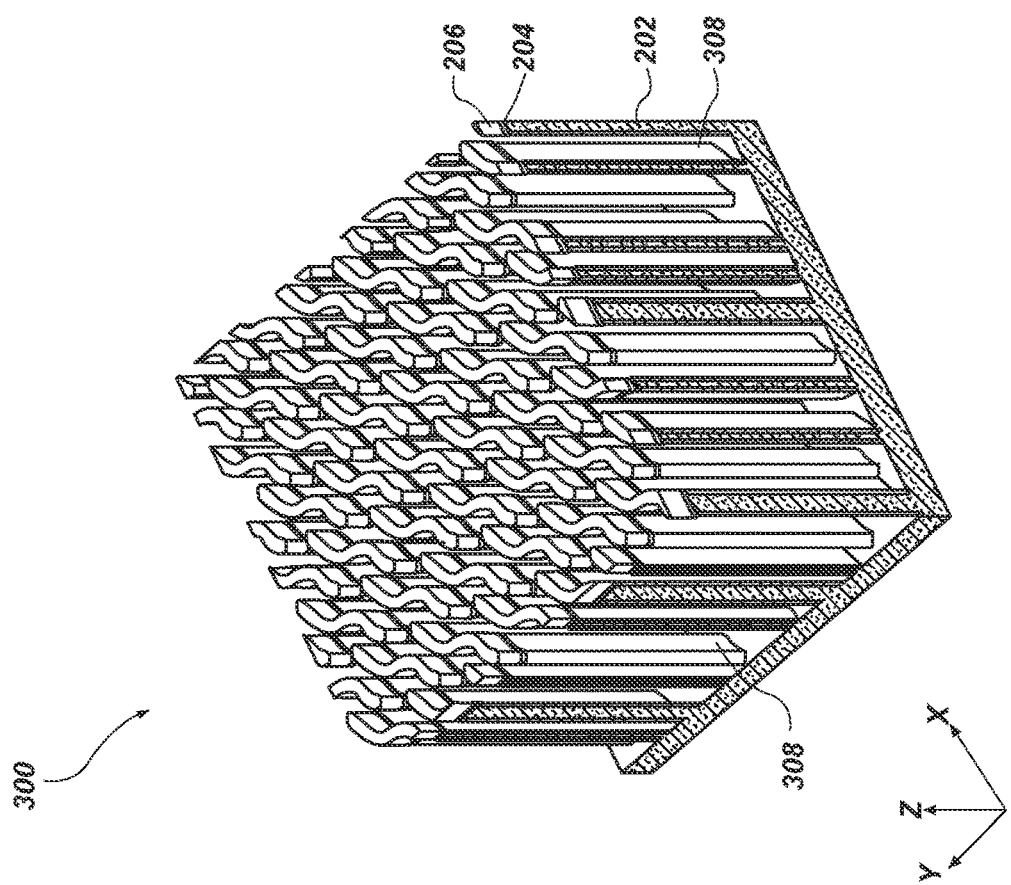

Referring to FIG. 3C, the pattern of the isolated structures 304 (FIG. 3B) may be transferred to the hard mask material 206, the first oxide material 204, and the base material 202, as described above with reference to FIG. 2G. For example, exposed portions of the second oxide material 208 may be removed through the spacers 224 and the spacers 224 may be removed. The exposed portions of the first oxide material 204 and the base material 202 may be removed through the hard mask material 206 and trenches 308 may be formed within the base material 202.

With reference to FIG. 3D, an insulative material 310 may be formed over the microelectronic device 300 and within the trenches 308 (FIG. 3C) of the base material 202, as described above with reference to the insulative material 240 (FIG. 2H). The insulative material 310 may include one or more of the materials described above with reference to the insulative material 240. In some embodiments, the insulative material 310 comprises silicon dioxide.

After forming the insulative material 310, the hard mask material 206 and the first oxide material 204 may be removed. Removal of the hard mask material 206 and the first oxide material 204 may leave a pattern of isolated memory cell structures 312 of the base material 202 defined at least partially by the holes 302 (FIG. 3A).

Figure 3E:
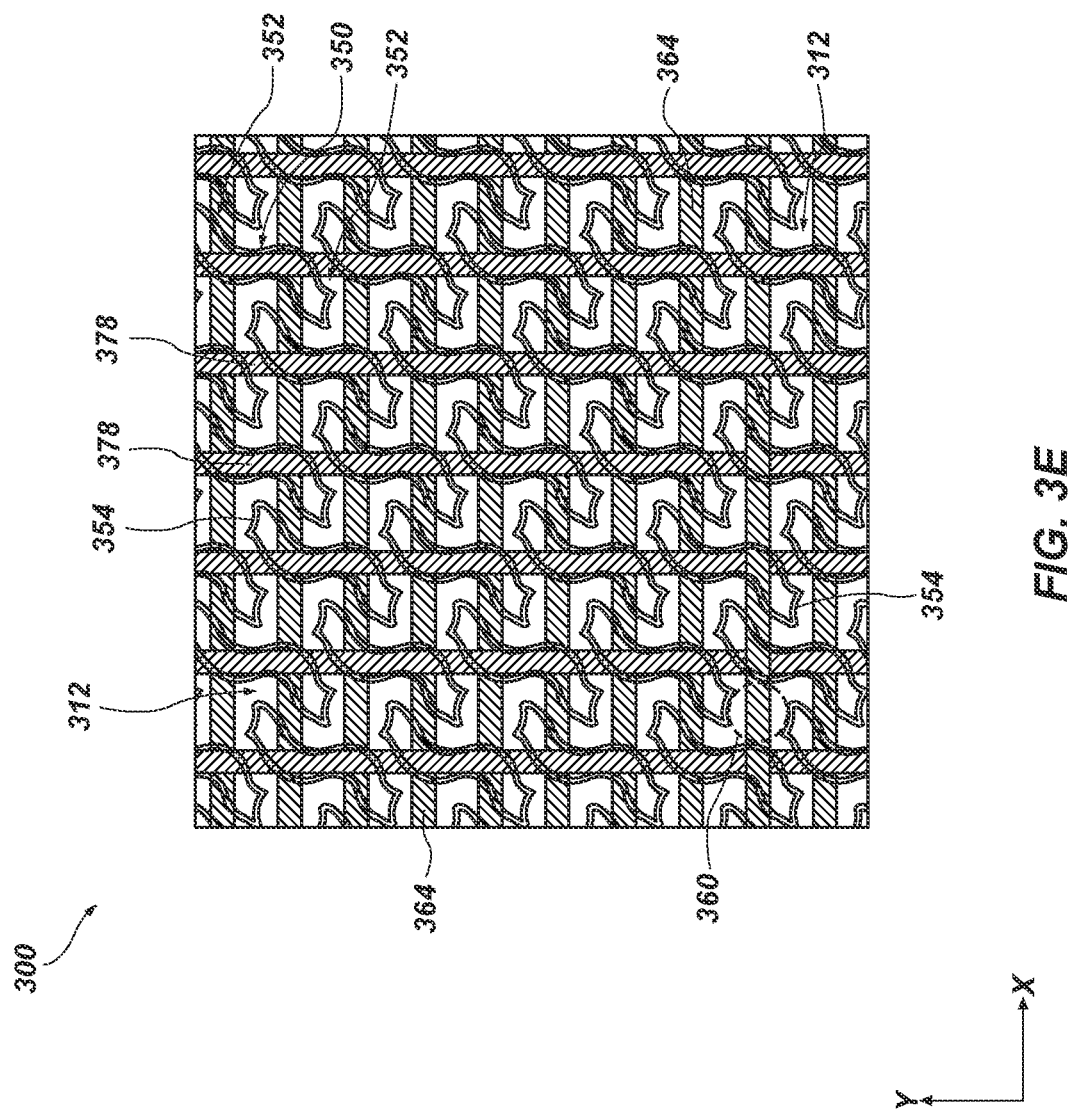

FIG. 3E is a simplified partial top-down view of the microelectronic device 300 of FIG. 3D after further processing acts. By way of non-limiting example, the microelectronic device 300 may be further processed to include digit line contacts (not shown), storage node contacts (not shown), digit lines 378, and word lines 364, as described above with reference to the microelectronic device 100 of FIG. 1O through FIG. 1S. Storage node contacts may be formed in contact with the isolated memory cell structures 312 at storage node contact regions (not shown) and digit line contacts may be formed in contact with digit line contact regions (not shown) of the memory cell structures 312, as described above with reference to FIG. 1O through FIG. 1S.

The isolated memory cell structures 312 may be substantially similar to the isolated memory cell structures of FIG. 2I and FIG. 2J except that the isolated memory cell structures 312 may not include the substantially linear walls 254 (FIG. 2J) of the central portion 250 (FIG. 2J) and the substantially linear walls 256 (FIG. 2J) of the end portions 252 (FIG. 2J). Rather, with reference to FIG. 3E, a central portion 350 of each of the isolated memory cell structures 312 may be defined by arcuate (e.g., curved) surfaces of the spacers 224 (FIG. 3B) that are, in turn, defined by the arcuate surfaces of the lines 218 (FIG. 2A, FIG. 2B) of the photoresist material 216 (FIG. 2A, FIG. 2B). In some embodiments, the central portion 350 and end portions 352 may each individually comprise arcuate surfaces and may be substantially free of substantially linear surfaces.

With continued reference to FIG. 3E, in some embodiments, laterally terminal portions of the end portions 352 of the isolated memory cell structures 312 may be defined by an arcuate surface 354 that is defined by the size and shape of the holes 302 (FIG. 3A) of the multilayer resist material 232 (FIG. 3A). For example, dashed circle 360 corresponds to the holes 302 and defines the arcuate surfaces 354 of the isolated memory cell structures 312. In some embodiments, the arcuate surface 354 of the end portions 352 include an inwardly oriented portion between opposing sides of the end portion 352. The inwardly oriented portion may be closer to the central portion 350 than the other portions of the arcuate surface 354 of the laterally terminal portions of the end portion 352.

Figure 4B:
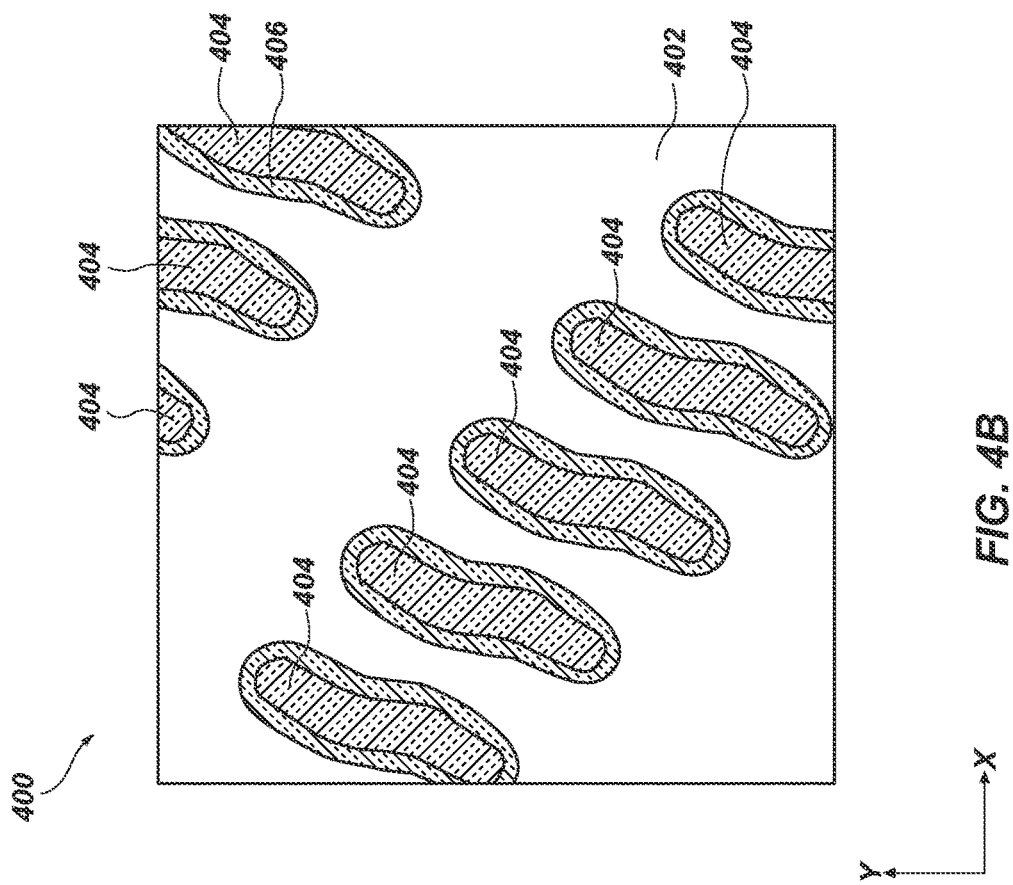
FIG. 4A through FIG. 4D are simplified partial top-down views illustrating a method of forming a microelectronic device, in accordance with yet additional embodiments of the disclosure.
Figure 4A:
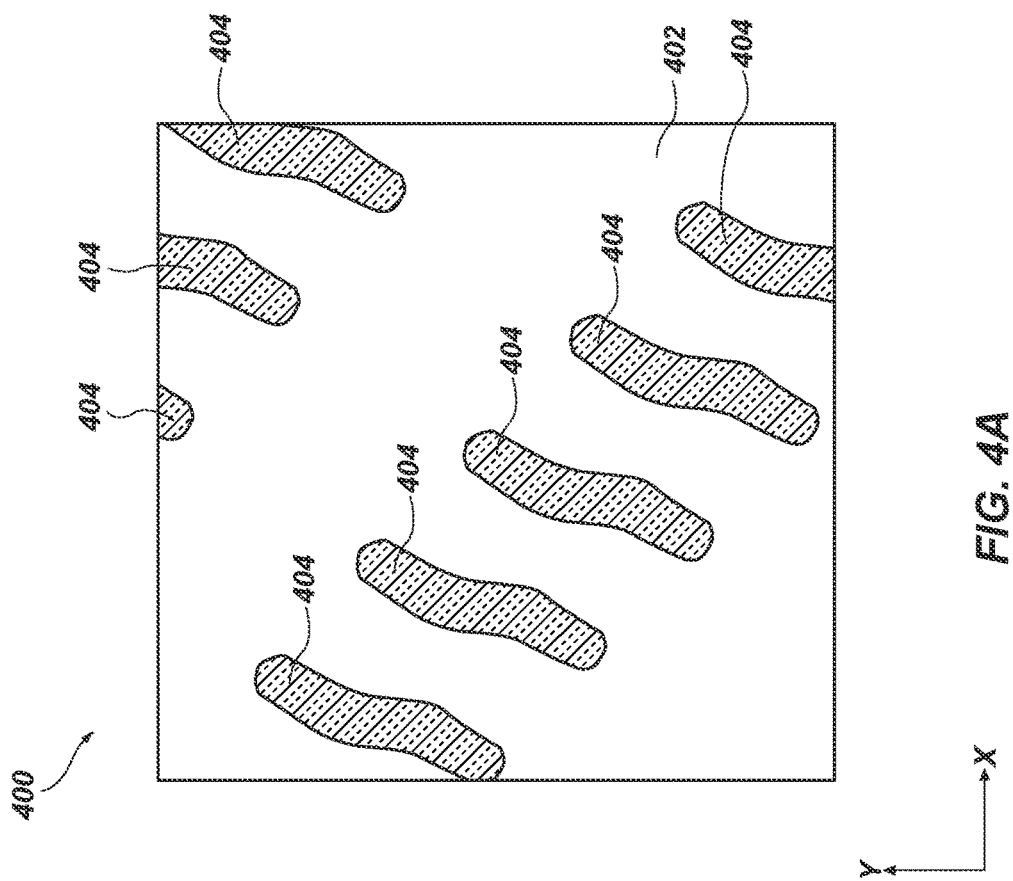

FIG. 4A through FIG. 4D illustrate a method of forming a microelectronic device, in accordance with additional embodiments of the disclosure. FIG. 4A is a simplified partial top-down view of a microelectronic device 400, in accordance with embodiments of the disclosure. The microelectronic device 400 may include a sacrificial material 402 overlying a hard mask material (not shown). The hard mask material may be substantially the same as the hard mask material 106 (FIG. 1A) described above. The hard mask material may vertically overlie a base material, which may be substantially the same as the base material 102 described above with reference to FIG. 1A.

A pattern of first structures 404 may be patterned in the sacrificial material 402 by, for example, extreme ultraviolet lithography. By way of non-limiting example, a photoresist material may be formed over the sacrificial material 402 and the pattern of the first structures 404 may be printed on the photoresist material. The pattern of the first structures 404 may be formed (e.g., printed) as known in the art. In some embodiments, portions of the photoresist material other than portions corresponding to the first structures 404 may be removed. The pattern of the first structures 404 may be transferred to the sacrificial material 402 through the photoresist material and the photoresist material may be removed (e.g., stripped) from surfaces of the sacrificial material 402, leaving the pattern of the first structures 404 in the sacrificial material 402.

Referring now to FIG. 4B, first spacers 406 may be formed on sides of the first structures 404. The first spacers 406 may be formed of and include one or more of the materials described above with reference to the spacers 130 (FIG. 1C). In some embodiments, the first spacers 406 comprises a carbon-containing material, such as silicon carbon nitride.

Figure 4C:
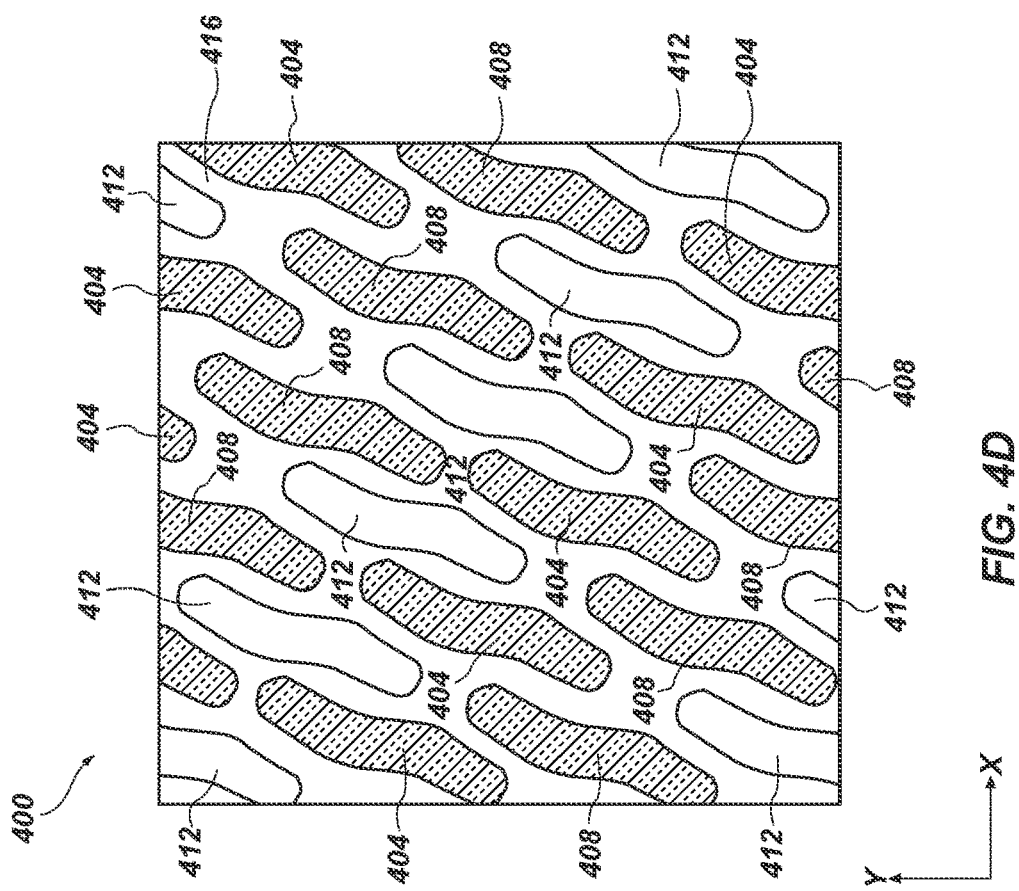

With reference to FIG. 4C, a pattern of second structures 408 may be formed within the sacrificial material 402. In some embodiments, the pattern of the second structures 408 may be formed in substantially the same method as forming the pattern of the first structures 404. By way of non-limiting example, in some embodiments, a photoresist material may be formed over the microelectronic device 400 and patterned by, for example, extreme ultraviolet lithography to form the pattern of second structures 408.

The pattern of the second structures 408 may be substantially the same as the pattern of the first structures 404, except that the pattern of the second structures 408 may be laterally (e.g., in the X-direction, in the Y-direction) shifted relative to the pattern of the first structures 404. The pattern of the second structures 408 in the photoresist material may be transferred to the sacrificial material 402. In some embodiments, the first spacers 406 around the first structures 404 may facilitate alignment of the second structures 408 with respect to the first structures 404. In some embodiments, the first spacers 406 may compensate for potential misalignment (e.g., misregistration) of the second structures 408 during formation of the second structures 408. In other words, the first spacers 406 may facilitate self-alignment of the second structures 408 with the first structures 404.

With continued reference to FIG. 4C, after transferring the pattern of the second structures 408 to the sacrificial material 402, second spacers 410 may be formed around the second structures 408. The second spacers 410 may be formed of and include one or more of the materials described above with reference to the first spacers 406.

Figure 4D:
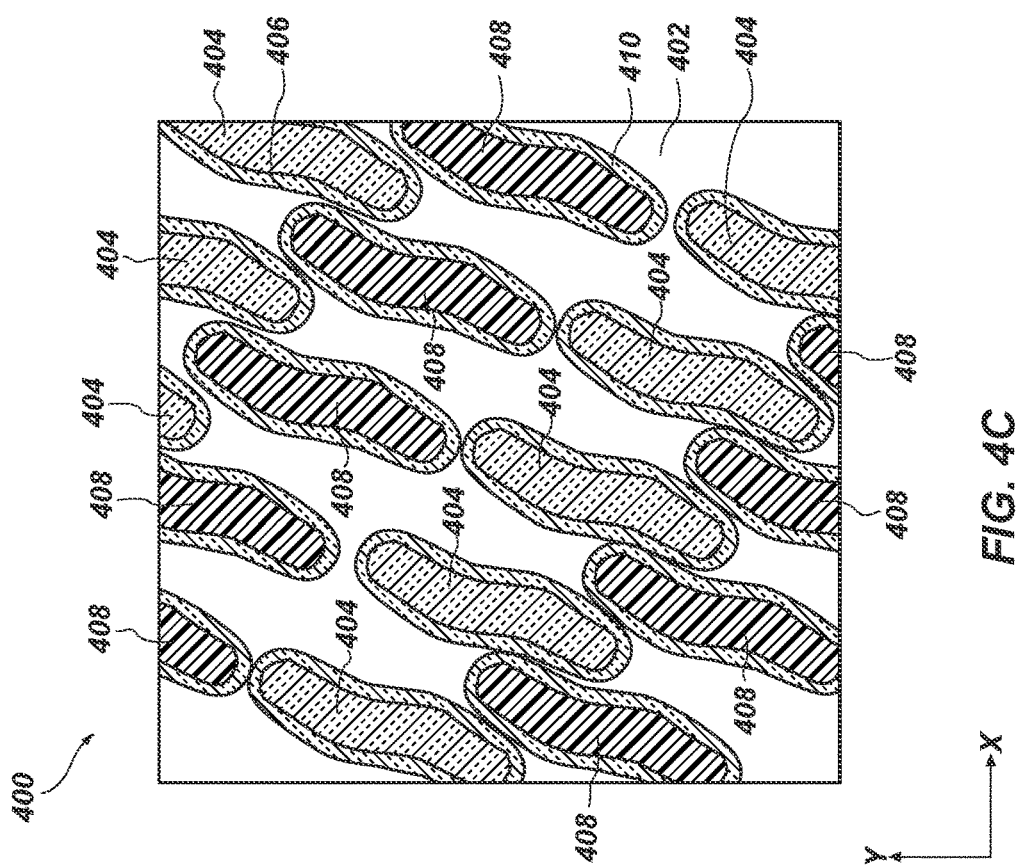

With reference to FIG. 4D, after forming the second spacers 410 around the second structures 408, a hard mask material may fill remaining portions of the microelectronic device 400 between the first spacers 406 and the second spacers 410. After filling the portions of the microelectronic device 400 with the hard mask material, the first spacers 406 and the second spacers 410 may be selectively removed, leaving the first structures 404, the second structures 408, and third structures 412 comprising the sacrificial material 402. The pattern of the first structures 404, the second structures 408, and the third structures 412 may be transferred to the underlying hard mask material and the underlying base material to form isolated memory cell structures, as described above with reference to FIG. 1N, FIG. 2H, and FIG. 3D.

With continued reference to FIG. 4D, each of the first structures 404, the second structures 408, and the third structures 412 may be separated from each other by trenches 416 formed with the base material at locations corresponding to the first spacers 406 and the second spacers 410.

In some embodiments, the first structures 404 may exhibit substantially the same size and shape as the second structures 408. The third structures 412 may exhibit a different size and shape than the first structures 404 and the second structures 408. In some embodiments, the third structures 412 exhibit a relatively larger dimension along a longitudinal axis (e.g., in the Y-direction) than the first structures 404 and the second structures 408. In some embodiments, each of the first structures 404, the second structures 408, and the third structures 412 comprise a center portion having substantially parallel sides and end portions angled with respect to the center portion and having substantially parallel sides, as described above with reference to the isolated memory cell structures 245 (FIG. 2J). In some embodiments, laterally terminal portions of the end portions of the first structures 404, the second structures 408, and the third structures 412 may not include arcuate surfaces, as described above with reference to the isolated memory cell structures 245. In some embodiments, each of the first structures 404, the second structures 408, and the third structures 412 exhibits a "Z-shape."

As described above with reference to the isolated memory cell structures 145 (FIG. 1O), the isolated memory cell structures 245 (FIG. 2J), and the memory cell structures 312 (FIG. 3E), the microelectronic device 400 may be subjected to additional processing acts. For example, the microelectronic device 400 may be further processed to include digit line contacts (not shown), storage node contacts (not shown), digit lines (not shown), and word lines (not shown), as described above with reference to the microelectronic device 100 of FIG. 1O through FIG. 1R. Storage node contacts may be formed in contact with the isolated memory cell structures of the microelectronic device 400 at storage node contact regions and digit line contacts may be formed in contact with digit line contact regions of the memory cell structures, as described above with reference to FIG. 1O through FIG. 1S.

Figure 5:
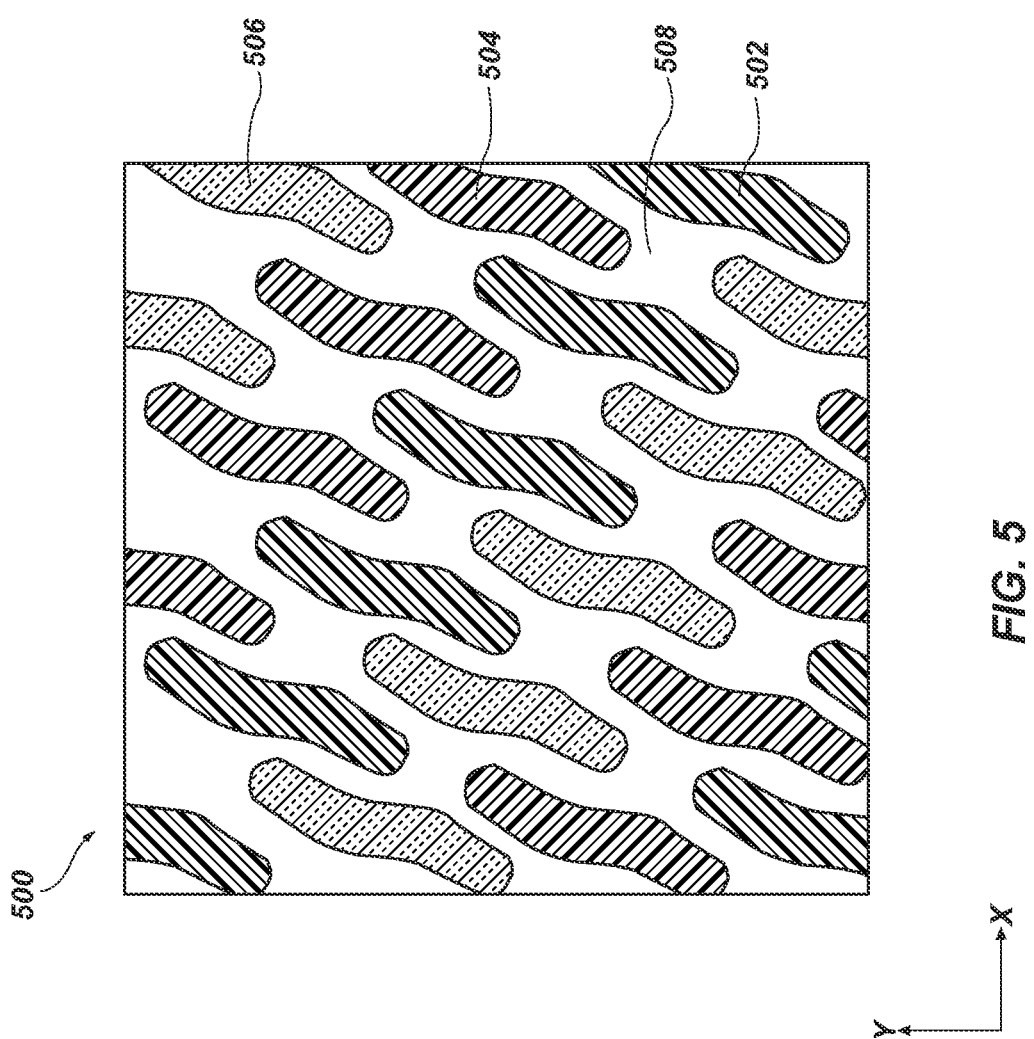
FIG. 5 is a simplified partial top-down view illustrating a microelectronic device, in accordance with embodiments of the disclosure.

FIG. 5 is a simplified partial top-down view of a microelectronic device 500, in accordance with additional embodiments of the disclosure. The microelectronic device 500 may include a pattern of first structures 502, a pattern of second structures 504, and a pattern of third structures 506 spaced from neighboring structures by trenches 508. Each of the first structures 502, the second structures 504, and the third structures 506 may comprise substantially the same material composition and may be formed in a base material comprising a semiconductive material, such as one or more of the materials described above with reference to the base material 102.

In some embodiments, each of the first structures 502, the second structures 504, and the third structures 506 may exhibit substantially the same size and shape. In some embodiments, the first structures 502, the second structures 504, and the third structures 506 are substantially the same as the first structures 404 (FIG. 4D) and the second structures 408 (FIG. 4D).

In some embodiments, the microelectronic device 500 is formed using extreme ultraviolet lithography. By way of non-limiting example, the first structures 502 may be formed in a hard mask material (e.g., printed into a hard mask material) using extreme ultraviolet patterning. In some embodiments, a pattern of first structures 502 may be formed in the hard mask material, such as by extreme ultraviolet patterning. In some embodiments, a photoresist material may be formed over a hard mask material and the first structures 502 may be printed on the photoresist material, as described above with reference to formation of the first structures 404 (FIG. 4A). After forming the first structures 502, each of the second structures 504 and the third structures 506 may be formed in the hard mask material, as described above with reference to formation of the first structures 502. After forming the pattern of the first structures 502, the second structures 504, and the third structures 506 in the hard mask material, the hard mask material may be used to transfer the first structures 502, the second structures 504, and the third structures 506 to the underlying base material to form isolated memory cell structures.

The microelectronic device 500 may be subjected to additional processing acts, as described above with reference to the microelectronic device 400 of FIG. 4D. For example, the microelectronic device 500 may be further processed to include digit line contacts (not shown), storage node contacts (not shown), digit lines (not shown), and word lines (not shown), as described above with reference to the microelectronic device 100 of FIG. 1O through FIG. 1S. Storage node contacts may be formed in contact with the isolated memory cell structures of the microelectronic device 500 at storage node contact regions and digit line contacts may be formed in contact with digit line contact regions of the isolated memory cell structures, as described above with reference to FIG. 1O through FIG. 1S.

Thus, in accordance with embodiments of the disclosure, a microelectronic device comprises memory cell structures extending from a base material. At least one memory cell structure of the memory cell structures comprises a central portion in contact with a digit line, extending from the base material and comprising opposing arcuate surfaces, an end portion in contact with a storage node contact on a side of the central portion, and an additional end portion in contact with an additional storage node contact on an opposite side of the central portion.

Thus, in accordance with additional embodiments of the disclosure, a microelectronic device comprises memory cell structures each comprising semiconductive pillar structures extending from a base material. At least one memory cell structure of the memory cell structures comprises a first end portion and a second end portion, each of the first end portion and the second end portion individually comprising at least one arcuate surface, a central portion between the first end portion and the second end portion, the central portion comprising substantially parallel surfaces extending between the first end portion and the second end portion, at least one surface of the substantially parallel surfaces connected to the at least one arcuate surface of the first end portion, a storage node contact in contact with the first end portion, and a digit line contact in contact with the central portion.

Thus, in accordance with additional embodiments of the disclosure, a method of forming a microelectronic device comprises forming lines of a material comprising at least some nonlinear surfaces by extreme ultraviolet lithography, forming spacers on the lines of the material, removing the lines of the material, forming a mask over the spacers, removing a portion of the spacers through the mask to form isolated structures, each isolated structure comprising a central portion between a first end portion and a second end portion, and transferring a pattern of the isolated structures to a semiconductive material.

Thus in accordance with further embodiments of the disclosure, a method of forming a microelectronic device comprises forming a pattern of first structures in a hard mask material by extreme ultraviolet lithography, forming first spacers on the first structures, forming a pattern of second structures in the hard mask material, forming second spacers on the second structures, forming a material in regions between the first spacers and the second spacers to form a pattern of third structures, removing the first spacers and the second spacers, and removing portions of a semiconductive material underlying the hard mask material exposed through the first structures, the second structures, and the third structures to form a pattern of the first structures, the second structures, and the third structures in the semiconductive material.

Thus, in accordance with yet additional embodiments of the disclosure, a method of forming a microelectronic device comprises forming a pattern of first structures in a hard mask material, forming a pattern of second structures offset from the first structures in the hard mask material, and forming a pattern of third structures in the hard mask material laterally offset from the first structures and the second structures, the third structures exhibiting substantially the same size and shape as the first structures and the second structures.

Figure 6:
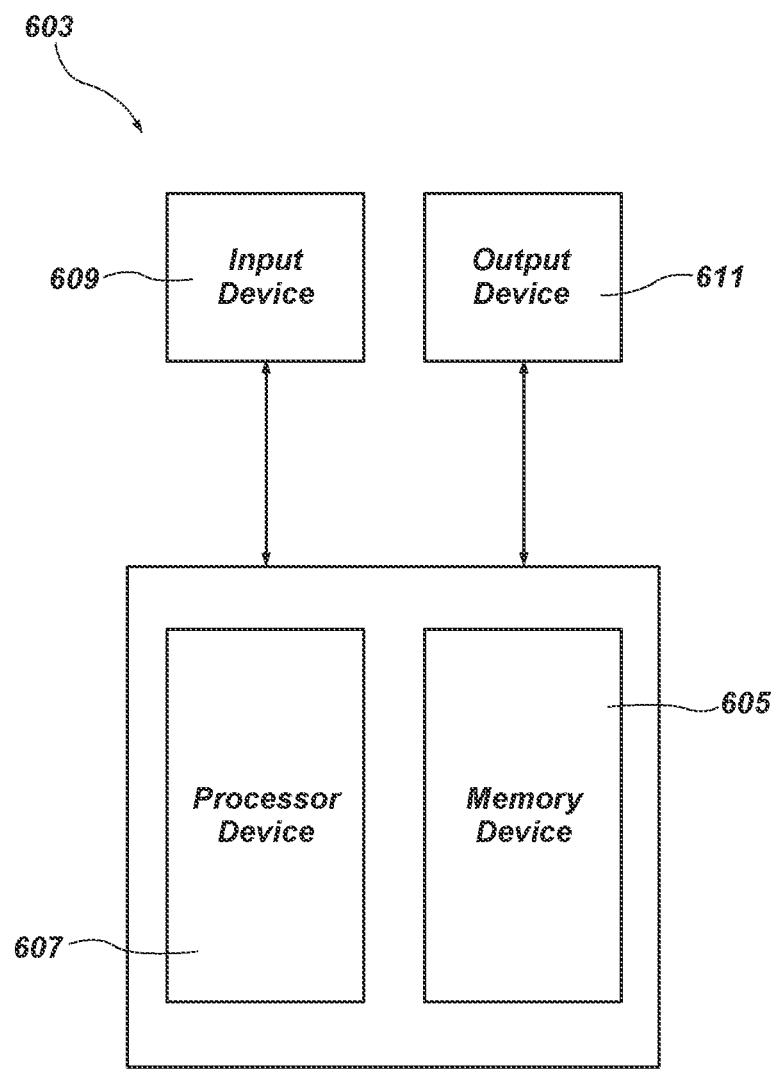
FIG. 6 is a block diagram of an electronic system, in accordance with embodiments of the disclosure.

Microelectronic devices including microelectronic devices (e.g., one or more of the microelectronic devices 100, 200, 300, 400, 500) formed according to embodiments described herein may be used in embodiments of electronic systems of the disclosure. For example, FIG. 6 is a block diagram of an electronic system 603, in accordance with embodiments of the disclosure. The electronic system 603 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 603 includes at least one memory device 605. The memory device 605 may include, for example, an embodiment of a microelectronic device previously described herein (e.g., one or more of the microelectronic devices 100, 200, 300, 400, 500) previously described with reference to FIG. 1A through FIG. 5.

The electronic system 603 may further include at least one electronic signal processor device 607 (often referred to as a "microprocessor"). The electronic signal processor device 607 may, optionally, include an embodiment of a microelectronic device previously described herein (e.g., one or more of the microelectronic device 100, 200, 300 400, 500 previously described with reference to FIG. 1A through FIG. 5). The electronic system 603 may further include one or more input devices 609 for inputting information into the electronic system 603 by a user, such as, for example, a mouse or other pointing device, a keyboard, a touchpad, a button, or a control panel. The electronic system 603 may further include one or more output devices 611 for outputting information (e.g., visual or audio output) to a user such as, for example, a monitor, a display, a printer, an audio output jack, a speaker, etc. In some embodiments, the input device 609 and the output device 611 may comprise a single touchscreen device that can be used both to input information to the electronic system 603 and to output visual information to a user. The input device 609 and the output device 611 may communicate electrically with one or more of the memory device 605 and the electronic signal processor device 607.

Figure 7:
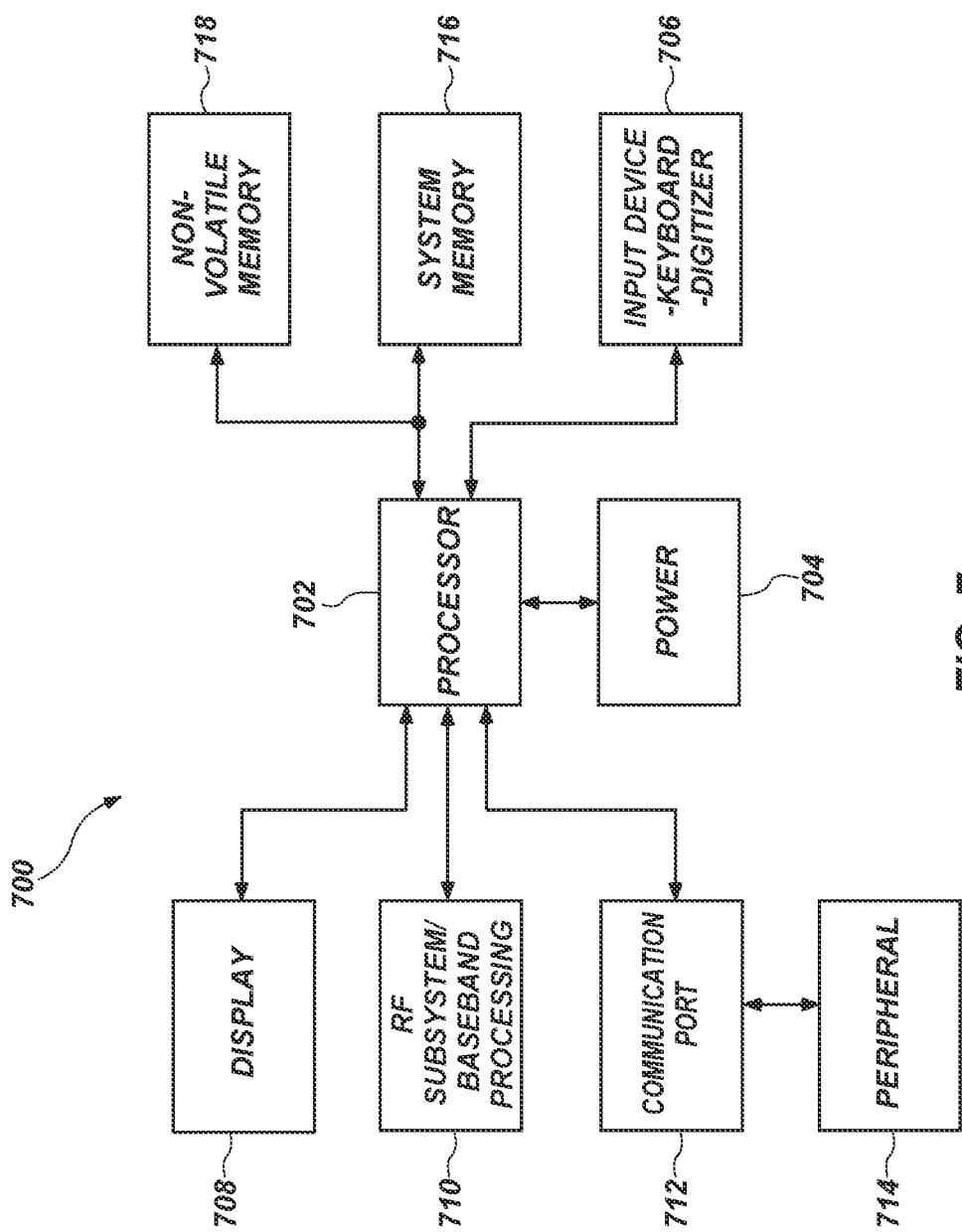
FIG. 7 is a block diagram of a processor-based system, in accordance with embodiments of the disclosure.

With reference to FIG. 7, depicted is a processor-based system 700. The processor-based system 700 may include various microelectronic devices and microelectronic device structures (e.g., microelectronic devices 100, 200, 300, 400, 500) manufactured in accordance with embodiments of the present disclosure. The processor-based system 700 may be any of a variety of types such as a computer, pager, cellular phone, personal organizer, control circuit, or other electronic device. The processor-based system 700 may include one or more processors 702, such as a microprocessor, to control the processing of system functions and requests in the processor-based system 700. The processor 702 and other subcomponents of the processor-based system 700 may include microelectronic devices and microelectronic device structures (e.g., microelectronic devices 100, 200, 300, 400, 500) manufactured in accordance with embodiments of the present disclosure.

The processor-based system 700 may include a power supply 704 in operable communication with the processor 702. For example, if the processor-based system 700 is a portable system, the power supply 704 may include one or more of a fuel cell, a power scavenging device, permanent batteries, replaceable batteries, and rechargeable batteries. The power supply 704 may also include an AC adapter; therefore, the processor-based system 700 may be plugged into a wall outlet, for example. The power supply 704 may also include a DC adapter such that the processor-based system 700 may be plugged into a vehicle cigarette lighter or a vehicle power port, for example.

Various other devices may be coupled to the processor 702 depending on the functions that the processor-based system 700 performs. For example, a user interface 706 may be coupled to the processor 702. The user interface 706 may include input devices such as buttons, switches, a keyboard, a light pen, a mouse, a digitizer and stylus, a touch screen, a voice recognition system, a microphone, or a combination thereof. A display 708 may also be coupled to the processor 702. The display 708 may include an LCD display, an SED display, a CRT display, a DLP display, a plasma display, an OLED display, an LED display, a three-dimensional projection, an audio display, or a combination thereof. Furthermore, an RF sub-system/baseband processor 710 may also be coupled to the processor 702. The RF sub-system/baseband processor 710 may include an antenna that is coupled to an RF receiver and to an RF transmitter (not shown). A communication port 712, or more than one communication port 712, may also be coupled to the processor 702. The communication port 712 may be adapted to be coupled to one or more peripheral devices 714, such as a modem, a printer, a computer, a scanner, or a camera, or to a network, such as a local area network, remote area network, intranet, or the Internet, for example.

The processor 702 may control the processor-based system 700 by implementing software programs stored in the memory. The software programs may include an operating system, database software, drafting software, word processing software, media editing software, or media playing software, for example. The memory is operably coupled to the processor 702 to store and facilitate execution of various programs. For example, the processor 702 may be coupled to system memory 716, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 716 may include volatile memory, non-volatile memory, or a combination thereof. The system memory 716 is typically large so that it can store dynamically loaded applications and data. In some embodiments, the system memory 716 may include semiconductor devices, such as the microelectronic devices (e.g., the microelectronic devices 100, 200, 300, 400, 500) described above.

The processor 702 may also be coupled to non-volatile memory 718, which is not to suggest that system memory 716 is necessarily volatile. The non-volatile memory 718 may include one or more of STT-MRAM, MRAM, read-only memory (ROM) such as an EPROM, resistive read-only memory (RROM), and flash memory to be used in conjunction with the system memory 716. The size of the non-volatile memory 718 is typically selected to be just large enough to store any necessary operating system, application programs, and fixed data. Additionally, the non-volatile memory 718 may include a high-capacity memory such as disk drive memory, such as a hybrid-drive including resistive memory or other types of non-volatile solid-state memory, for example. The non-volatile memory 718 may include microelectronic devices, such as the microelectronic devices (e.g., the microelectronic devices 100, 200, 300, 400, 500) described above.

Thus, in accordance with embodiments of the disclosure an electronic system comprises an input device, an output device, a processor device operably coupled to the input device and the output device, and a memory device operably coupled to the processor device and comprising at least one microelectronic device. The at least one microelectronic device comprises memory cell structures spaced from each other. At least one memory cell structure of the memory cell structures comprises a central portion between two end portions each oriented at an angle with respect to the central portion, and a digit line in electrical communication with the central portion, surfaces of the digit line oriented at an angle with respect to surfaces of the central portion.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A microelectronic device, comprising:
memory cell structures comprising elongated pillars extending from a base material, at least one memory cell structure of the memory cell structures comprising:
a central portion in contact with a digit line contact, the central portion extending from the base material and comprising opposing arcuate surfaces;
a first end portion on a first side of the central portion, the first end portion being in contact with a first storage node contact, the first end portion having a longitudinal axis in a horizontal plane substantially parallel to a major plane of the base material, the longitudinal axis of the first end portion being oriented at a non-zero angle with respect to a longitudinal axis of the central portion in the horizontal plane; and
a second end portion on a second side of the central portion opposite the first side, the second end portion being in contact with a second storage node contact.

2. The microelectronic device of claim 1, wherein the central portion of the at least one memory cell structure exhibits a minimum width proximate the digit line contact.

3. The microelectronic device of claim 1, wherein the first end portion of the at least one memory cell structure comprises at least one arcuate surface and at least one substantially linear surface.

4. The microelectronic device of claim 1, wherein a distal end of the first end portion of the at least one memory cell structure exhibits an arcuate surface.

5. The microelectronic device of claim 1, wherein the first end portion of the at least one memory cell structure comprises opposing arcuate surfaces.

6. The microelectronic device of claim 1, wherein the at least one memory cell structure is located between at least two other memory cell structures.

7. The microelectronic device of claim 6, wherein a distance between the at least one memory cell structure and a first of the at least two other memory cells structures is different than a distance between the at least one memory cell structure and a second of the at least two other memory cell structures.

8. The microelectronic device of claim 1, further comprising a first word line between the central portion and the first end portion of the at least one memory cell structure.

9. The microelectronic device of claim 8, further comprising a second word line between the central portion and the second end portion of the at least one memory cell structure.

10. The microelectronic device of claim 1, wherein:
the first end portion of the at least one memory cell structure comprises at least one arcuate surface and at least one substantially linear surface opposite the at least one arcuate surface; and
the second end portion comprises at least one additional arcuate surface and at least one additional substantially linear surface opposite the at least one additional arcuate surface, the central portion defined by the opposing arcuate surfaces including the at least one arcuate surface of the first end portion and the at least one additional arcuate surface of the second end portion.

11. The microelectronic device of claim 1, wherein the first end portion comprises a substantially linear surface substantially parallel to a substantially linear surface of the second end portion.

12. The microelectronic device of claim 1, further comprising a storage node structure in electrical communication with the first storage node contact.

13. The microelectronic device of claim 1, wherein the non-zero angle is within a range between about 20 degrees and about 70 degrees.

14. The microelectronic device of claim 1, wherein the non-zero angle is within a range between about 40 degrees and about 50 degrees.

15. The microelectronic device of claim 1, wherein a size of the first end portion and a size of the second end portion are substantially the same.

16. The microelectronic device of claim 1, wherein the digit line contact of the at least one memory cell structure is horizontally aligned with a storage node contact of a horizontally neighboring memory cell structure.

17. The microelectronic device of claim 1, wherein the first end portion comprises a substantially linear surface distal from the digit line contact.

18. The microelectronic device of claim 1, wherein a substantially linear surface of the first end portion of the at least one memory cell structure is parallel to a substantially linear surface of an additional end portion of a horizontally neighboring additional memory cell structure.

19. The microelectronic device of claim 1, further comprising a digit line vertically overlying the central portion and extending substantially parallel to the longitudinal axis of the central portion.

20. The microelectronic device of claim 19, wherein a width of the digit line in a horizontal direction that is substantially orthogonal to another horizontal direction in which the digit line extends is less than a width of the central portion in the horizontal direction.

21. The microelectronic device of claim 1, wherein the first end portion is in contact with the first storage node contact at a distal end of the first end portion relative to the central portion.

22. The microelectronic device of claim 21, wherein the distal end of the first end portion lies along the longitudinal axis of the first end portion.

23. The microelectronic device of claim 1, wherein the elongated pillars comprise a first semiconductive pillar at the first end portion, the first storage node contact overlapping a first side of the first semiconductive pillar, and the first side of the first semiconductive pillar being a distal side relative to the central portion.

24. A method of forming a microelectronic device, the method comprising:
forming lines of a material comprising at least some nonlinear surfaces by extreme ultraviolet lithography;
forming spacers on the lines of the material;
removing the lines of the material;
forming a mask over the spacers;
removing a portion of the spacers through the mask to form isolated structures; and
transferring a pattern of the isolated structures to a semiconductive material to form memory cell structures comprising elongated pillars extending from a base material, at least one memory cell structure of the memory cell structure comprising:
a central portion in contact with a digit line contact, the central portion extending from a base material of the semiconductive material and comprising opposing arcuate surfaces;
a first end portion on a first side of the central portion, the first end portion being in contact with a first storage node contact, the first end portion having a longitudinal axis in a horizontal plane substantially parallel to a major plane of the base material, the longitudinal axis of the first end portion being oriented at a non-zero angle with respect to a longitudinal axis of the central portion in the horizontal plane; and
a second end portion on a second side of the central portion opposite the first side, the second end portion being in contact with a second storage node contact.

25. The method of claim 24, wherein forming lines of a material comprising at least some nonlinear surfaces comprises forming lines exhibiting a sinusoidal shape.

26. The method of claim 24, wherein forming lines of a material comprising at least some nonlinear surfaces comprises forming lines comprising first portions and second portions, each line comprising first portions comprising arcuate surfaces and a larger dimension than a second portion between neighboring first portions of the line.

27. The method of claim 24, wherein forming a mask over the spacers comprises forming the mask to include trenches extending at an angle with respect to the spacers.

28. The method of claim 27, further comprising removing portions of the spacers through the trenches in the mask.

29. The method of claim 24, wherein forming a mask over the spacers comprises forming the mask to include circular openings.

30. The method of claim 29, further comprising removing portions of the spacers through the circular openings in the mask.

31. The method of claim 24, wherein removing a portion of the spacers through the mask to form isolated structures comprises forming the isolated structures to comprise the central portion comprising the opposing arcuate surfaces.

32. The method of claim 24, wherein removing a portion of the spacers through the mask to form isolated structures comprises forming the isolated structures to comprise the central portion between the first end portion and the second end portion, each of the first end portion and the second end portion individually comprising a terminal portion comprising an arcuate surface.

33. An electronic system, comprising:
- an input device;
- an output device;
- a processor device operably coupled to the input device and the output device; and
- a memory device operably coupled to the processor device and comprising at least one microelectronic device, the at least one microelectronic device comprising:
  - memory cell structures spaced from each other, at least one memory cell structure of the memory cell structures comprising elongated pillars comprising:
    - a central portion extending from a base material, being in contact with a digit line contact, and comprising opposing arcuate surfaces;
    - a first end portion on a first side of the central portion, the first end portion being in contact with a first storage node, the first end portion having a longitudinal axis in a horizontal plane substantially parallel to a major plane of the base material, the longitudinal axis of the first end portion being oriented at a non-zero angle with respect to a longitudinal axis of the central portion in the horizontal plane;
    - a second end portion on a second side of the central portion opposite the first side, the second end portion being in contact with a second storage node contact; and
  - a digit line in electrical communication with the digit line contact, surfaces of the digit line oriented at an angle with respect to surfaces of the central portion.

* * * * *

UNITED STATES PATENT AND TRADEMARK OFFICE
CERTIFICATE OF CORRECTION

PATENT NO. : 12,022,647 B2
APPLICATION NO. : 17/323516
DATED : June 25, 2024
INVENTOR(S) : Stephen D. Snyder et al.

Page 1 of 1

It is certified that error appears in the above-identified patent and that said Letters Patent is hereby corrected as shown below:

In the Specification

| | | |
|---|---|---|
| Column 1, | Line 21, | change "features, in addition," to --features. In addition,-- |
| Column 8, | Line 61, | change "comprises silicon-amorphous silicon." to --comprises amorphous silicon.-- |
| Column 18, | Line 17, | change "FIG. 18 have" to --FIG. 1S have-- |

Signed and Sealed this
Thirteenth Day of August, 2024

Katherine Kelly Vidal
*Director of the United States Patent and Trademark Office*